US011468927B2

(12) United States Patent
Sano

(10) Patent No.: US 11,468,927 B2
(45) Date of Patent: Oct. 11, 2022

(54) SEMICONDUCTOR STORAGE DEVICE

(71) Applicant: KIOXIA CORPORATION, Tokyo (JP)

(72) Inventor: Yuuta Sano, Yokosuka Kanagawa (JP)

(73) Assignee: KIOXIA CORPORATION, Tokyo (JP)

(*) Notice: Subject to any disclaimer, the term of this patent is extended or adjusted under 35 U.S.C. 154(b) by 0 days.

(21) Appl. No.: 17/187,578

(22) Filed: Feb. 26, 2021

(65) Prior Publication Data
US 2021/0407566 A1 Dec. 30, 2021

(30) Foreign Application Priority Data
Jun. 29, 2020 (JP) .............................. JP2020-111767

(51) Int. Cl.
G11C 7/10 (2006.01)

(52) U.S. Cl.
CPC ............ *G11C 7/1063* (2013.01); *G11C 7/103* (2013.01); *G11C 7/1039* (2013.01); *G11C 7/1078* (2013.01)

(58) Field of Classification Search
CPC ..... G11C 7/1063; G11C 7/103; G11C 7/1039; G11C 7/1078
USPC ...................... 365/189.011, 230.03
See application file for complete search history.

(56) References Cited

U.S. PATENT DOCUMENTS

| 9,396,775 | B2 | 7/2016 | Shirakawa et al. |
| 9,792,072 | B2 | 10/2017 | Yoo et al. |
| 10,003,675 | B2 | 6/2018 | Curewitz et al. |
| 2009/0165020 | A1* | 6/2009 | Allen ................... G06F 13/4243 719/314 |
| 2017/0046068 | A1* | 2/2017 | Tan ........................ G06F 12/02 |
| 2017/0046073 | A1* | 2/2017 | Guo ....................... G11C 29/76 |
| 2018/0275921 | A1* | 9/2018 | Katagiri .............. G06F 13/1673 |
| 2019/0087128 | A1* | 3/2019 | Shin ....................... G06F 3/0659 |
| 2019/0278518 | A1* | 9/2019 | Byun .................... G06F 3/0631 |
| 2019/0369916 | A1* | 12/2019 | Khon .................... G06F 3/0652 |
| 2020/0051600 | A1* | 2/2020 | Hwang ................ G11C 7/1063 |
| 2020/0142819 | A1 | 5/2020 | Shaeffer et al. |
| 2020/0143854 | A1* | 5/2020 | Kim ..................... G11C 7/1078 |
| 2020/0143856 | A1* | 5/2020 | Lim ..................... G11C 7/1045 |

(Continued)

FOREIGN PATENT DOCUMENTS

| JP | 2004-039055 A | 2/2004 | |
| JP | 4535565 B2 * | 9/2010 | ............. G11C 16/08 |

(Continued)

*Primary Examiner* — Michael T Tran
(74) *Attorney, Agent, or Firm* — Kim & Stewart LLP

(57) ABSTRACT

A semiconductor storage device includes a memory cell array, and a peripheral circuit that is connected to the memory cell array, and that inputs and outputs user data in response to an input of a command set including command data and address data. The peripheral circuit includes a command register, an address register, and a queue register. The command register includes an n-bit first register column capable of storing n-bit data forming the command data. The address register includes an n-bit second register column capable of storing n-bit data forming the address data. The queue register includes a plurality of third register columns, each capable of storing at least (n+1) bit data, and each third register column is capable of storing the n-bit data forming the command data or the n-bit data forming the address data.

20 Claims, 25 Drawing Sheets

(56) References Cited

U.S. PATENT DOCUMENTS

2020/0278808 A1\*  9/2020  Zhu ..................... G06F 3/0679
2020/0310646 A1\*  10/2020  Song ................... G11C 11/5628
2022/0068322 A1\*  3/2022  Cho ....................... G11C 7/065

FOREIGN PATENT DOCUMENTS

| JP | 4608174 B2 \* | 1/2011 | ............... G06F 3/08 |
| JP | 4770012 B2 \* | 9/2011 | ......... G06F 12/1441 |
| JP | 2015-176309 A | 10/2015 | |
| JP | 2018-139118 A | 9/2018 | |
| JP | 2018-160155 A | 10/2018 | |

\* cited by examiner

FIG. 12
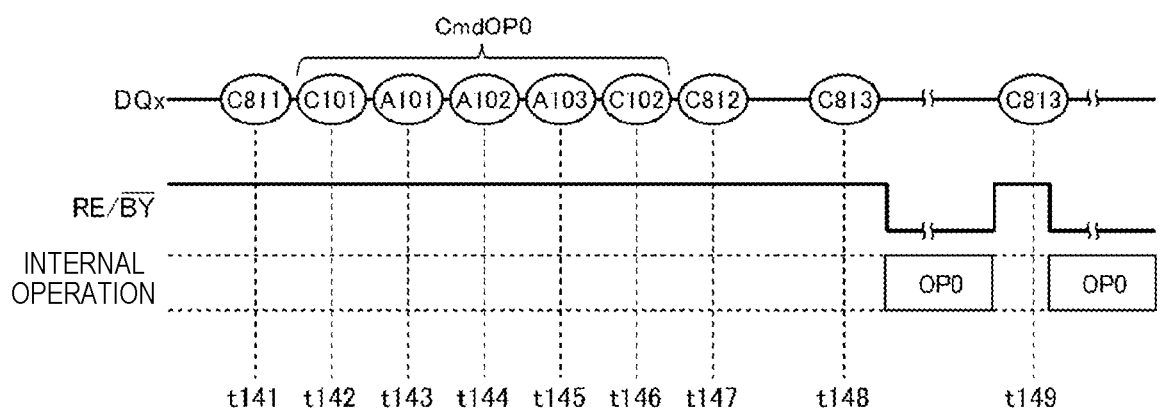
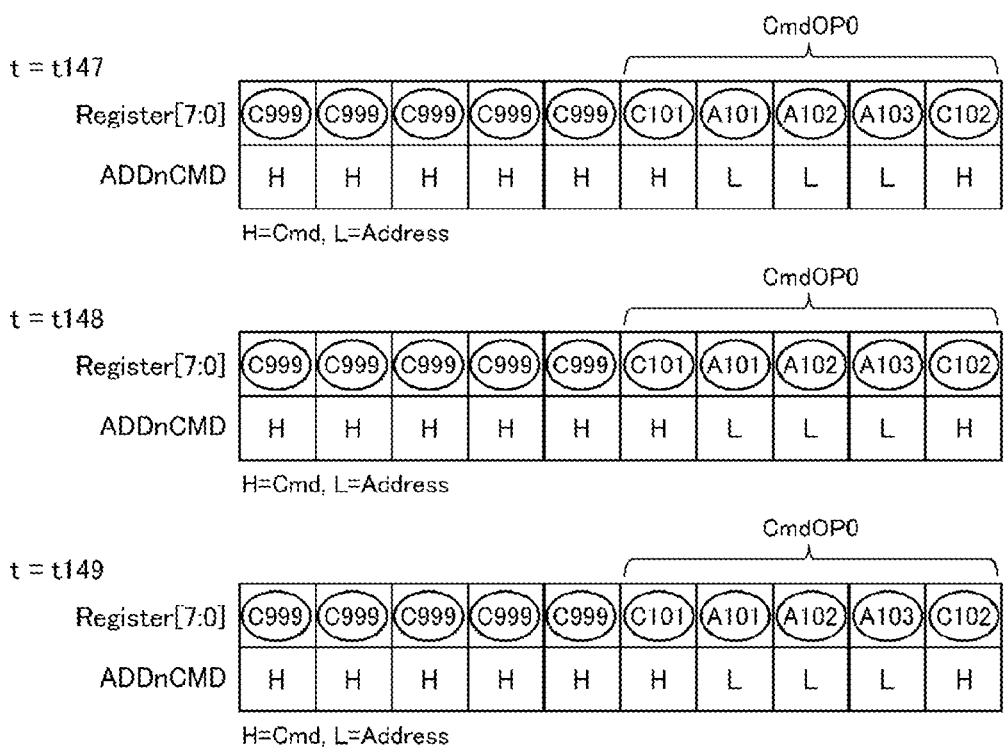

FIG. 13
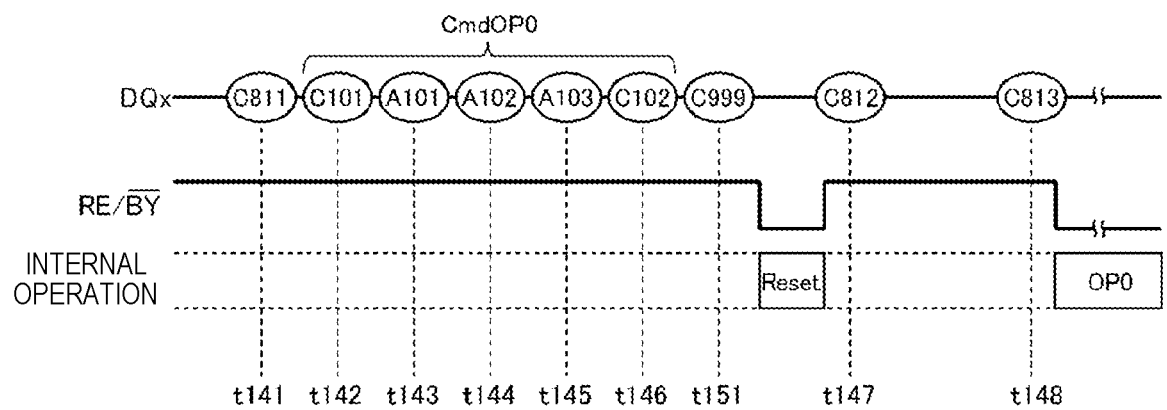
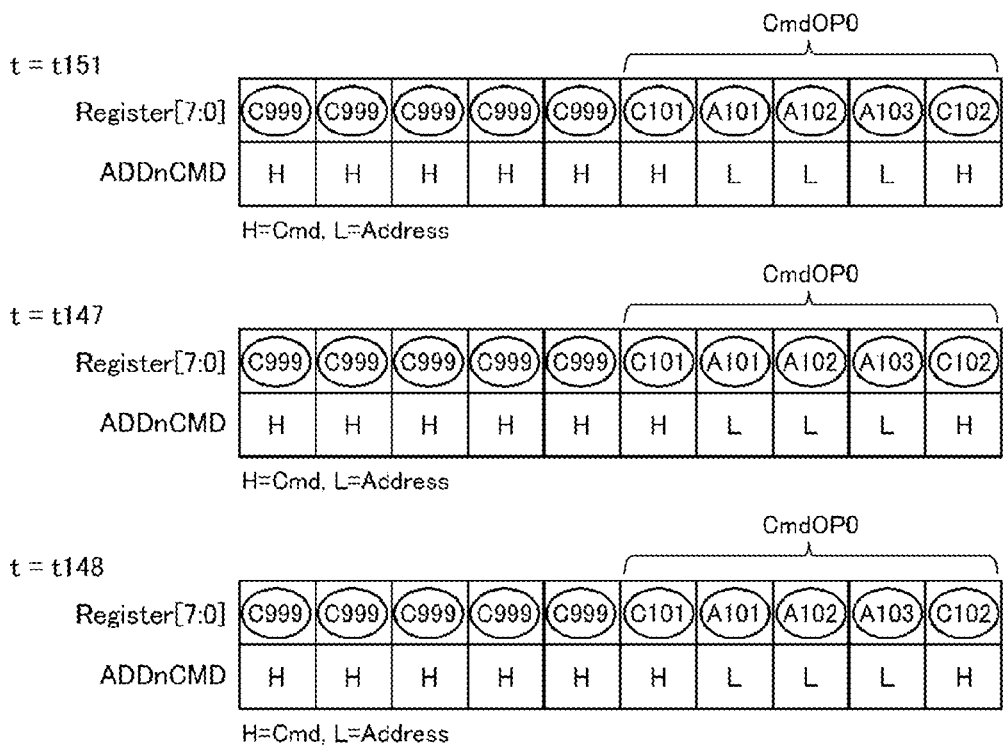

SEMICONDUCTOR STORAGE DEVICE

CROSS-REFERENCE TO RELATED APPLICATION

This application is based upon and claims the benefit of priority from Japanese Patent Application No. 2020-111767, filed on Jun. 29, 2020, the entire contents of which are incorporated herein by reference.

FIELD

Embodiments described herein relate generally to a semiconductor storage device.

BACKGROUND

Known is a semiconductor storage device including: a memory cell array including a plurality of memory cells; and a peripheral circuit connected to the memory cell array and outputting user data in response to an input of a command set including command data and address data.

An example of related art includes JP-A-2015-176309.

DESCRIPTION OF THE DRAWINGS

FIG. 12 is a timing chart illustrating the operation of the memory die MD.

FIG. 13 is a timing chart illustrating the operation of the memory die MD.

DETAILED DESCRIPTION

Figure 1:
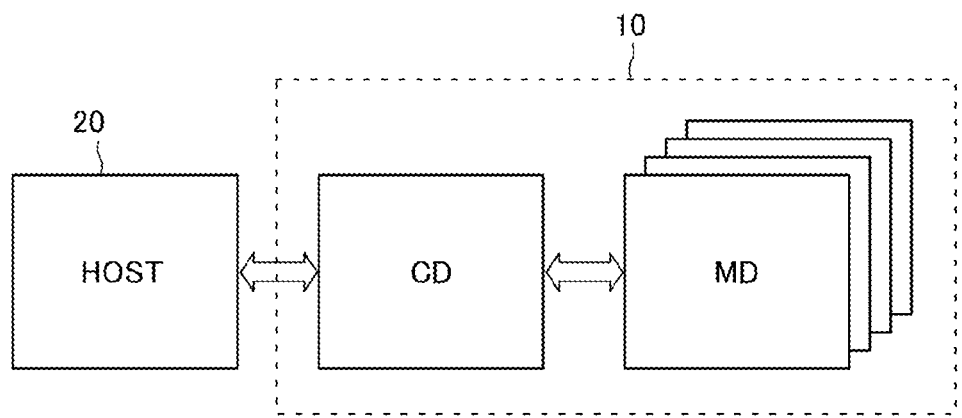
FIG. 1 is a schematic block diagram illustrating a configuration of a memory system according to a first embodiment.

Embodiments provide a semiconductor storage device that operates at a high speed.

In general, according to one embodiment, a semiconductor storage device includes a memory cell array including a plurality of memory cells, and a peripheral circuit that is connected to the memory cell array, and that inputs and outputs user data in response to an input of a command set including command data and address data. The peripheral circuit includes a command register, an address register, and a queue register. The command register includes an n-bit first register column capable of storing n (n is a natural number) bit data forming the command data. The address register includes an n-bit second register column capable of storing n-bit data forming the address data. The queue register includes a plurality of third register columns, each capable of storing at least (n+1) bit data, and each third register column is capable of storing the n-bit data forming the command data or the n-bit data forming the address data.

A semiconductor storage device according to one embodiment includes a memory cell array including a plurality of memory cells, and a peripheral circuit that is connected to the memory cell array, and that inputs and outputs user data in response to an input of a command set including command data and address data. The peripheral circuit includes a queue register capable of storing the input command set, and is configured to execute an internal operation corresponding to the command set stored in the queue register in response to an input of first command data without erasing the command set stored in the queue register.

A semiconductor storage device according to one embodiment includes a memory cell array including a plurality of memory cells, and a peripheral circuit that is connected to the memory cell array, and that inputs and outputs user data in response to an input of a command set including command data and address data. The peripheral circuit includes a queue register capable of storing the command set input during a busy period of the semiconductor storage device, during which a first internal operation is executed, and is configured to automatically execute a second internal operation corresponding to the command set stored in the queue register after the execution of the first internal operation.

Next, a semiconductor storage device according to an embodiment will be described in detail with reference to the drawings. The following embodiment is merely an example, and is not intended to limit the scope of the present disclosure.

When referring to the "semiconductor storage device" in the specification, the semiconductor storage device may indicate a memory die (or memory chip), and may indicate a memory system including a controller die such as a memory card and an SSD. The semiconductor storage device may indicate a configuration including a host computer such as a smart phone, a tablet terminal, and a personal computer.

In the specification, when it is said that a first element is "electrically connected" to a second element, the first element may be directly connected to the second element, and the first element may be connected to the second element via a piece of wiring, a semiconductor member, or a transistor. For example, when three transistors are connected to each other in series, a first transistor is "electrically connected" to a third transistor even though a second transistor is in an OFF state.

In the specification, when it is said that a first element is "connected between" a second element and a third element, it may indicate that the first element, the second element, and the third element are connected to each other in series, and the second element is connected to the third element via the first element.

In the specification, when it is said that a circuit "electrically connects" two pieces of wiring, it may indicate that, for example, the circuit includes a transistor, and the transistor is provided in a current path between the two pieces of wiring, such that the transistor goes into an ON state.

First Embodiment

[Memory System 10]

FIG. 1 is a schematic block diagram illustrating a configuration of a memory system 10 according to a first embodiment.

The memory system 10 reads, writes, and erases user data according to a signal transmitted from a host computer 20. The memory system 10 is, for example, a system capable of storing the memory card, the SSD, or other user data. The memory system 10 includes: a plurality of memory dies (or memory chips) MD that store the user data; and a controller die (or controller chip) CD connected to these plurality of memory dies MD and the host computer 20. The controller die CD includes, for example, a processor and a RAM, and performs a process such as conversion of a logical address and a physical address, bit error detection and correction, garbage collection (also referred to as "compaction"), and wear leveling.

Figure 2:
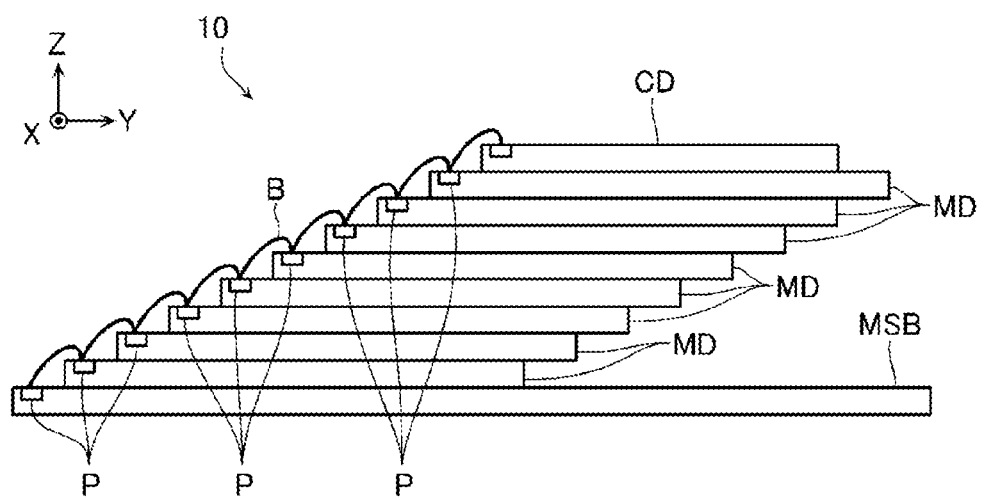
FIG. 2 is a schematic side view illustrating a configuration example of the memory system.
Figure 3:
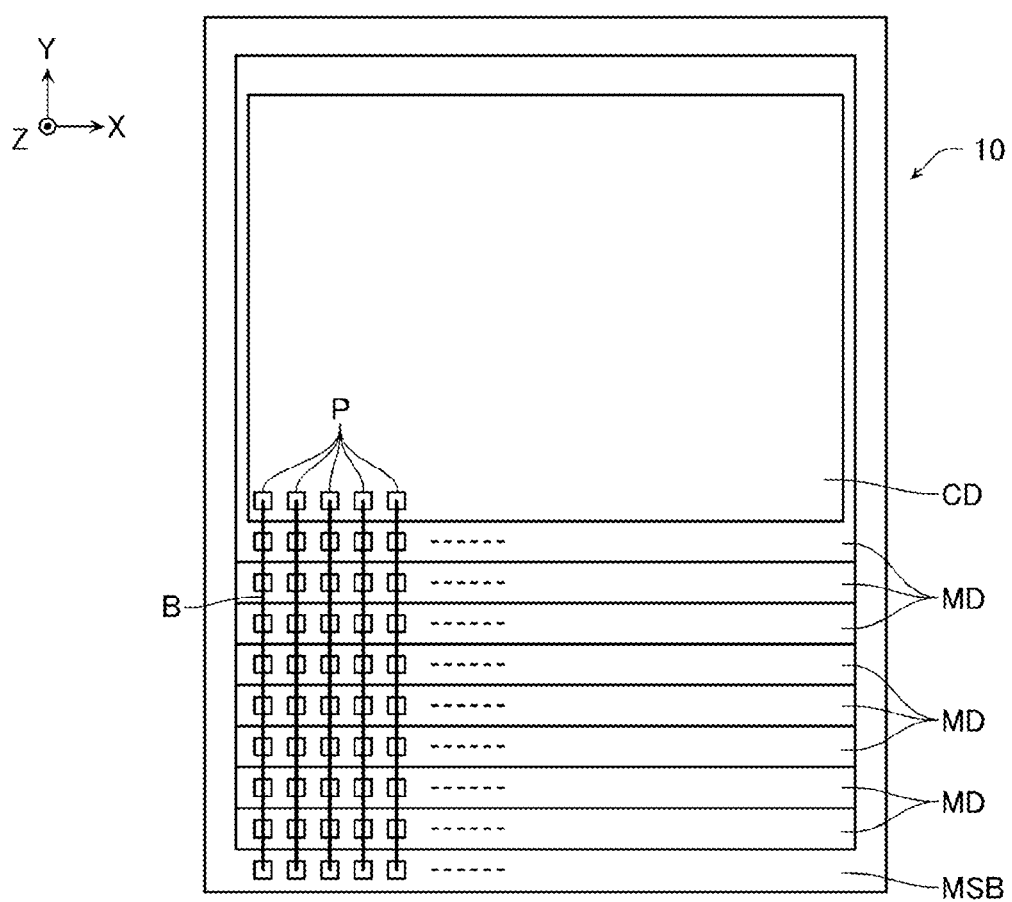
FIG. 3 is a schematic plan view illustrating the configuration example.

FIG. 2 is a schematic side view illustrating a configuration example of the memory system 10 according to the embodiment. FIG. 3 is a schematic plan view illustrating the configuration example. For the convenience of description, some portions of the configuration will be omitted in FIGS. 2 and 3.

As illustrated in FIG. 2, the memory system 10 according to the embodiment includes a mounting substrate MSB, the plurality of memory dies MD stacked on the mounting substrate MSB, and the controller die CD stacked on the memory die MD. A pad electrode P is provided in an area of an end portion in a Y direction on an upper surface of the mounting substrate MSB, and a part of the other area thereon is attached to a lower surface of the memory die MD via an adhesive. The pad electrode P is provided in an area of an end portion in the Y direction on an upper surface of the memory die MD, and the other area thereon is attached to a lower surface of another memory die MD or the controller die CD via an adhesive. The pad electrode P is provided in an area of an end portion in the Y direction on an upper surface of the controller die CD.

As illustrated in FIG. 3, the mounting substrate MSB, the plurality of memory dies MD, and the controller die CD respectively include a plurality of pad electrodes P arranged in an X direction. The mounting substrate MSB, the plurality of memory dies MD, and the plurality of pad electrodes P provided on the controller die CD are respectively connected to each other via bonding wires B.

The configuration illustrated in FIGS. 2 and 3 is merely an example, and a specific configuration may be changed. For example, in the example illustrated in FIGS. 2 and 3, the controller die CD is stacked on the plurality of memory dies MD, and these configurations are connected to each other by the bonding wires B. In the above-described configuration, the plurality of memory dies MD and the controller die CD are provided in one package. However, the controller die CD may be provided in a package different from the package including the memory die MD. The plurality of memory dies MD and the controller die CD may be connected to each other via through vias instead of the bonding wires B.

[Configuration of Memory Die MD]

Figure 4:
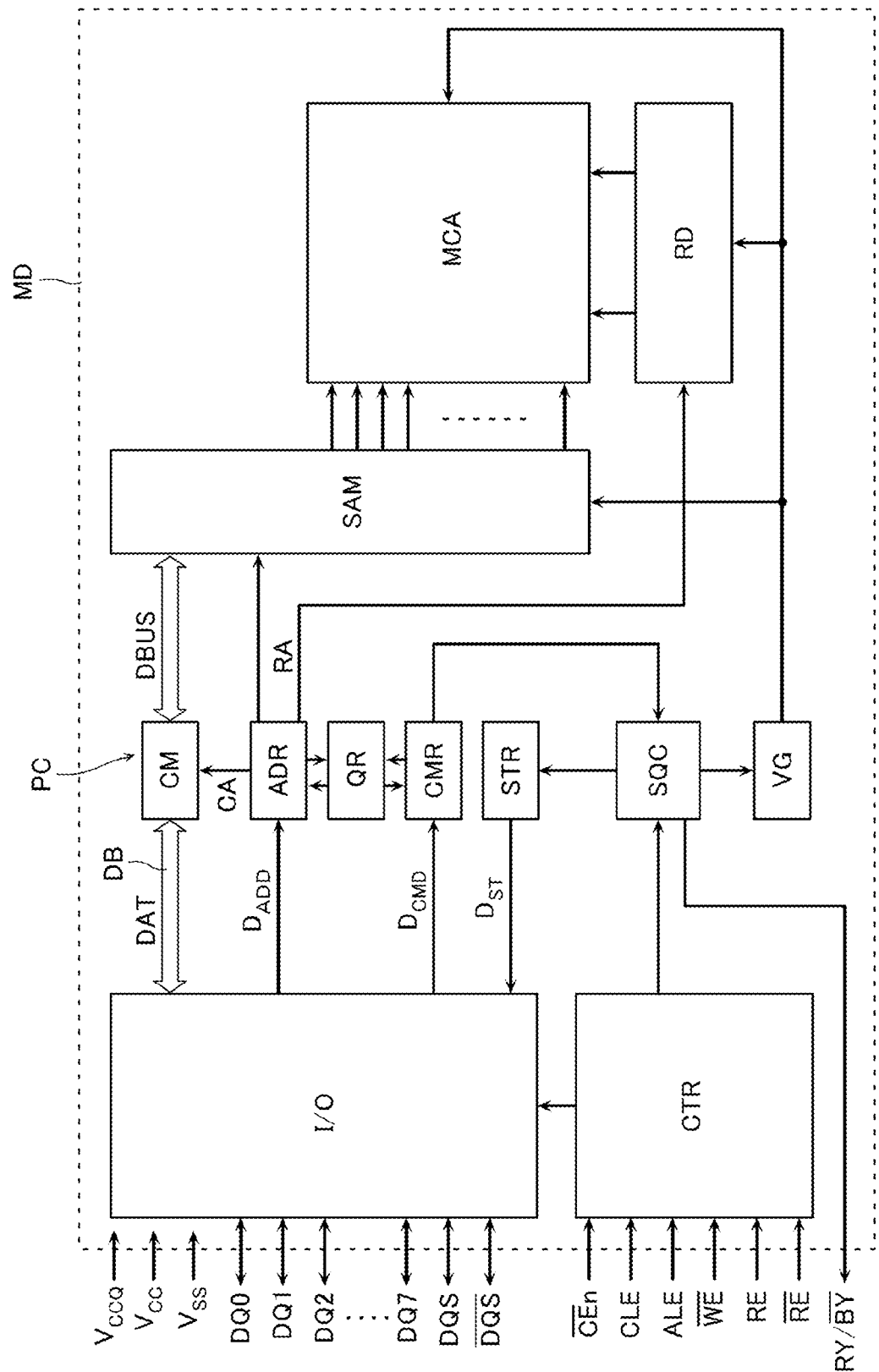
FIG. 4 is a schematic block diagram illustrating a configuration of a memory die MD according to the first embodiment.
Figure 5:
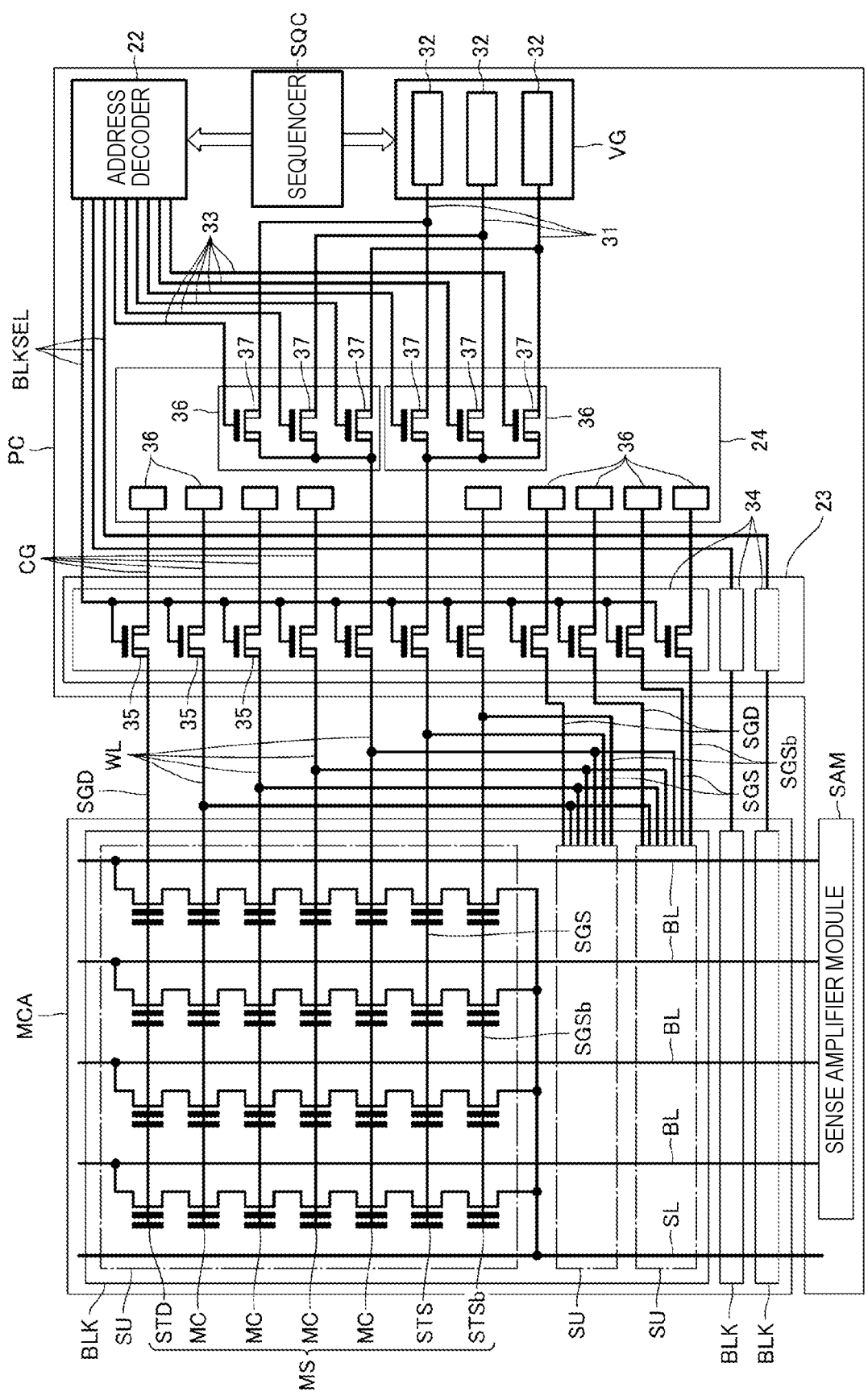
FIG. 5 is a schematic circuit diagram illustrating a partial configuration of the memory die MD.
Figure 6:
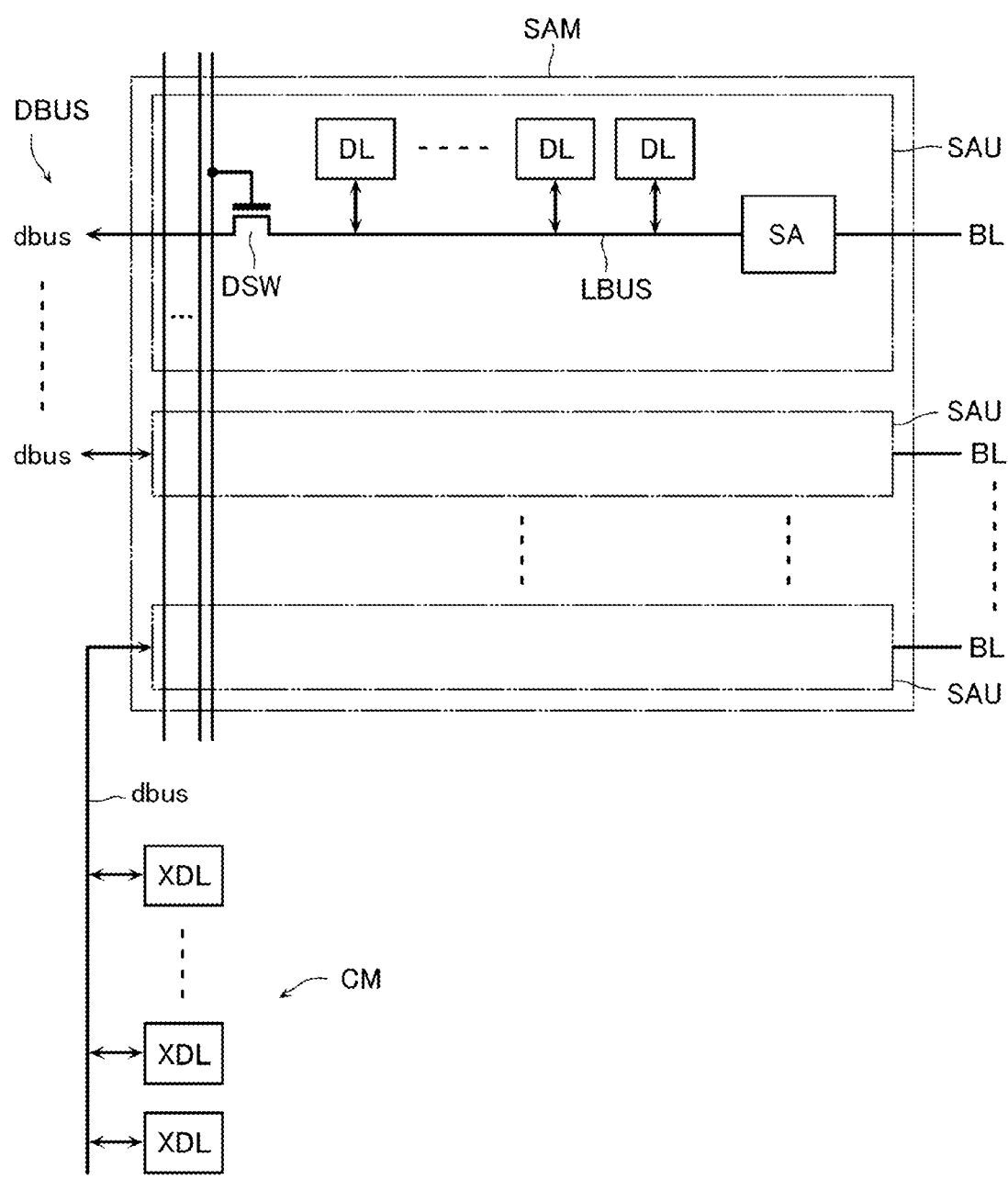
FIG. 6 is a schematic block diagram illustrating the partial configuration of the memory die MD.
Figure 7:
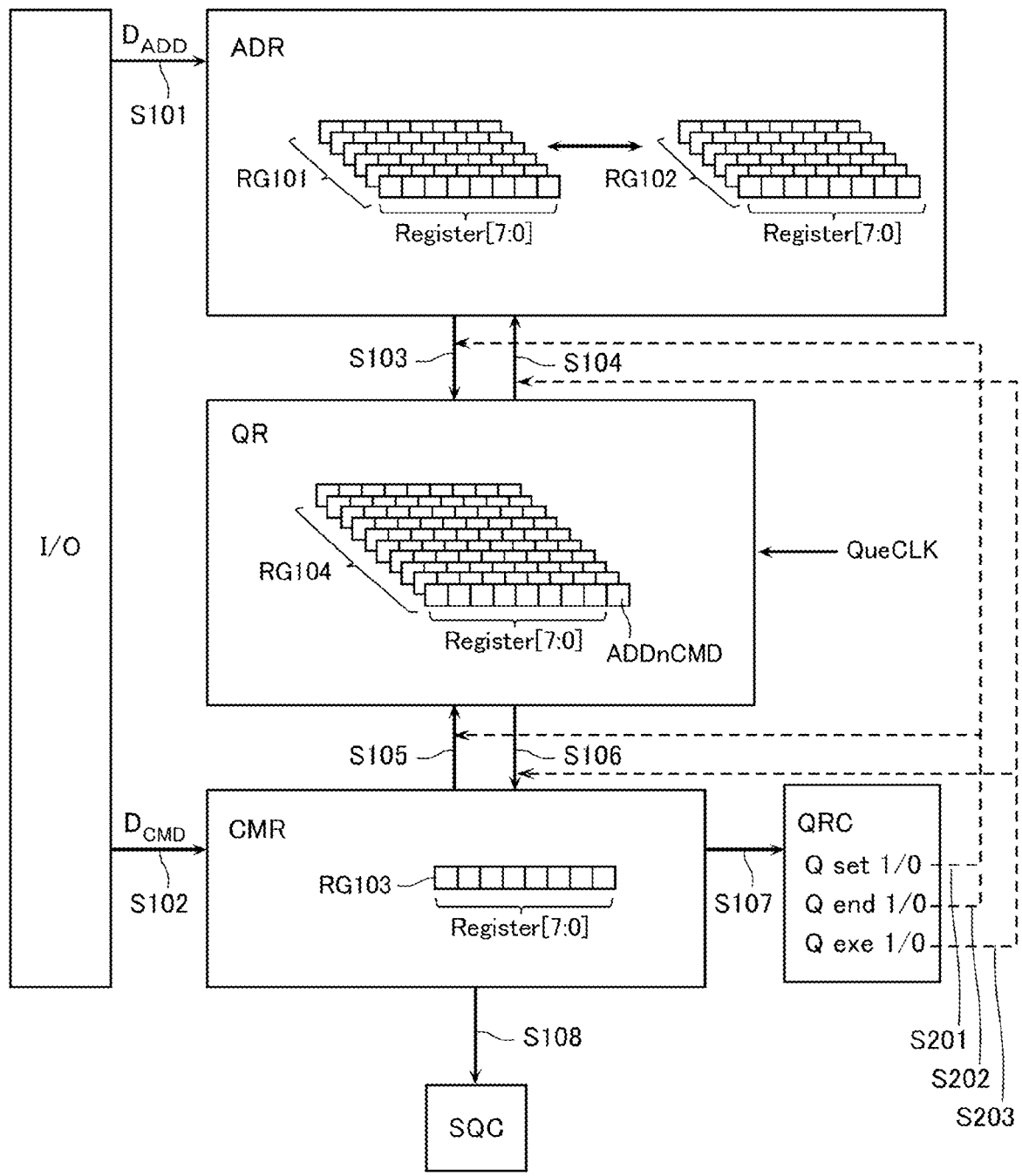
FIG. 7 is a schematic block diagram illustrating the partial configuration of the memory die MD.

FIG. 4 is a schematic block diagram illustrating a configuration of the memory die MD according to the first embodiment. FIG. 5 is a schematic circuit diagram illustrating a partial configuration of the memory die MD. FIGS. 6 and 7 are schematic block diagrams illustrating the partial configuration of the memory die MD.

FIG. 4 illustrates a plurality of control terminals. The plurality of control terminals may be represented as control terminals corresponding to a high active signal (positive logic signal), may be represented as control terminals corresponding to a low active signal (negative logic signal), and may be represented as control terminals corresponding to both the high active signal and the low active signal. In FIG. 4, a reference sign of the control terminal corresponding to the low active signal includes an overline. In the specification, the reference sign of the control terminal corresponding to the low active signal includes a slash ("/"). The description of FIG. 4 given above is merely an example, and a specific mode may be changed. For example, a part or all of the high active signals may be set to the low active signals, or a part or all of the low active signals may be set to the high active signals.

As illustrated in FIG. 4, the memory die MD includes a memory cell array MCA for storing data and a peripheral circuit PC connected to the memory cell array MCA. The peripheral circuit PC includes a voltage generation circuit VG, a row decoder RD, a sense amplifier module SAM, a cache memory CM, and a sequencer SQC. The peripheral circuit PC includes an input and output control circuit I/O and a logic circuit CTR. The peripheral circuit PC includes an address register ADR, a command register CMR, a queue register QR connected to the address register ADR and the command register CMR, and a queue register control circuit QRC (FIG. 7) that controls the queue register QR.

[Configuration of Memory Cell Array MCA]

As illustrated in FIG. 5, the memory cell array MCA includes a plurality of memory blocks BLK. The plurality of memory blocks BLK respectively include a plurality of string units SU. The plurality of string units SU respectively include a plurality of memory strings MS. One ends of the plurality of memory strings MS are respectively connected to the peripheral circuit PC via a bit line BL. The other ends of the plurality of memory strings MS are respectively connected to the peripheral circuit PC via a common source line SL.

The memory string MS includes a drain-side select transistor STD, a plurality of memory cells MC (also referred to as a memory transistor), a source-side select transistor STS, and a source-side select transistor STSb, which are connected in series between the bit line BL and the source line SL. Hereinafter, the drain-side select transistor STD, the source-side select transistor STS, and the source-side select transistor STSb may be simply referred to as select transistors (STD, STS, and STSb).

The memory cell MC is a field effect type transistor including a semiconductor layer functioning as a channel area, a gate insulating film including a charge storage film, and a gate electrode. A threshold voltage of the memory cell MC changes depending on an amount of charge in the charge storage film. The memory cell MC stores data of one bit or a plurality of bits. A word line WL is connected to each of the gate electrodes of the plurality of memory cells MC corresponding to one memory string MS. Each of the word lines WL is commonly connected to all the memory strings MS in one memory block BLK.

The select transistors (STD, STS, and STSb) are field effect type transistors including a semiconductor layer functioning as a channel area, a gate insulating film, and a gate electrode. Select gate lines (SGD, SGS, and SGSb) are respectively connected to the gate electrodes of the select transistors (STD, STS, and STSb). The drain-side select gate line SGD is provided corresponding to the string unit SU and is commonly connected to all the memory strings MS in one string unit SU. The source-side select gate line SGS is commonly connected to all the memory strings MS in the plurality of string units SU. The source-side select gate line SGSb is commonly connected to all the memory strings MS in the plurality of string units SU.

[Configuration of Voltage Generation Circuit VG]

For example, as illustrated in FIG. 5, the voltage generation circuit VG (FIG. 4) is connected to a plurality of voltage supply lines 31. The voltage generation circuit VG includes, for example, a step-down circuit such as a regulator and a step-up circuit such as a charge pump circuit 32. The step-down circuit and the step-up circuit are respectively connected to voltage supply lines to which a power supply voltage $V_{CC}$ and a ground voltage $V_{SS}$ (FIG. 4) are supplied. The voltage supply lines are connected to, for example, the pad electrodes P described with reference to FIGS. 2 and 3. The voltage generation circuit VG generates, for example, a plurality of types of operating voltages applied to the bit line BL, the source line SL, the word line WL, and the select gate lines (SGD, SGS, and SGSb) during a read operation, a write operation, and an erasing operation with respect to the memory cell array MCA according to a control signal from the sequencer SQC, and simultaneously outputs the generated plurality of types of operating voltages to the plurality of voltage supply lines 31. The operating voltage output from the voltage supply line 31 may be adjusted according to the control signal from the sequencer SQC.

[Configuration of Row Decoder RD]

As illustrated in FIG. 5, the row decoder RD (FIG. 4) includes: an address decoder 22 that decodes address data $D_{ADD}$; and a block selection circuit 23 and a voltage selection circuit 24 that transfer the operating voltage to the memory cell array MCA according to an output signal of the address decoder 22.

The address decoder 22 includes a plurality of block selection lines BLKSEL and a plurality of voltage selection lines 33. For example, the address decoder 22 acquires a row address RA from the address register ADR (FIG. 4) sequentially according to the control signal from the sequencer SQC, decodes the row address RA, turns ON a predetermined block selection transistor 35 and a predetermined voltage selection transistor 37 corresponding to the row address RA, and turns OFF the rest of the block selection transistors 35 and voltage selection transistors 37. For example, voltages of the predetermined block selection line BLKSEL and the predetermined voltage selection line 33 are set to "H" states, and voltages other than those are set to "L" states. When a P-channel type transistor is used instead of an N-channel type transistor, a reverse voltage is applied to these pieces of wiring.

In the example illustrated in the drawing, the address decoder 22 is provided with one block selection line BLKSEL for each memory block BLK. However, this configuration may be changed. For example, one block selection line BLKSEL may be provided for each of two or more memory blocks BLK.

The block selection circuit 23 includes a plurality of block selection units 34 corresponding to the memory block BLK. The plurality of block selection units 34 respectively include the plurality of block selection transistors 35 corresponding to the word line WL and the select gate lines (SGD, SGS, and SGSb). The block selection transistor 35 is, for example, a field effect type high breakdown voltage transistor. Drain electrodes of the block selection transistors 35 are electrically connected to the corresponding word lines WL or the select gate lines (SGD, SGS, and SGSb), respectively. Each source electrode is electrically connected to the voltage supply line 31 via wiring CG and the voltage selection circuit 24. The gate electrode is commonly connected to the corresponding block selection line BLKSEL.

The block selection circuit 23 further includes a plurality of transistors which are not illustrated. The plurality of transistors are field effect type high breakdown voltage transistors connected between the select gate lines (SGD, SGS, and SGSb) and the voltage supply line to which the ground voltage $V_{SS}$ is supplied. The plurality of transistors supply the ground voltage $V_{SS}$ to the select gate lines (SGD, SGS, and SGSb) in a non-selected memory block BLK. The plurality of word lines WL in the non-selected memory block BLK are in a floating state.

The voltage selection circuit 24 includes a plurality of voltage select units 36 corresponding to the word line WL and the select gate lines (SGD, SGS, and SGSb). The plurality of voltage select units 36 respectively include a plurality of voltage selection transistors 37. The voltage selection transistor 37 is, for example, a field effect type high breakdown voltage transistor. Drain terminals of the voltage selection transistors 37 are electrically connected to the corresponding word lines WL or the select gate lines (SGD, SGS, and SGSb) via the wiring CG and the block selection circuit 23, respectively. Each source terminal is electrically connected to the corresponding voltage supply line 31. Each gate electrode is connected to the corresponding voltage selection line 33.

[Configuration of Sense Amplifier Module SAM]

The sense amplifier module SAM includes, for example, a plurality of sense amplifier units SAU (FIG. 6) corresponding to a plurality of bit lines BL. Each of the sense amplifier units SAU includes a sense amplifier SA connected to the bit line BL, wiring LBUS connected to the sense amplifier SA, and a plurality of latch circuits DL connected to the wiring LBUS. The sense amplifier SA includes a sense circuit connected to the bit line BL, a voltage transfer circuit connected to the bit line BL, and a latch circuit connected to the sense circuit and the voltage transfer circuit. The sense circuit includes a sense transistor that goes into an ON state or an OFF state according to a voltage or a current of the bit line BL, and discharges a charge in the wiring LBUS according to the state. The voltage transfer circuit causes the bit line BL to be electrically connected to either one of the two voltage supply lines according to data latched by the latch circuit in the sense amplifier SA. The wiring LBUS in the sense amplifier unit SAU is connected to wiring dbus forming a bus DBUS via a switch transistor DSW.

[Configuration of Cache Memory CM]

The cache memory CM includes a plurality of latch circuits XDL (FIG. 6) connected to the latch circuit in the sense amplifier module SAM via a plurality of pieces of wiring dbus forming the bus DBUS. The latch circuit XDL stores, for example, user data written to the memory cell MC or user data read from the memory cell MC. The data DAT in the plurality of latch circuits XDL is sequentially transferred to the sense amplifier module SAM or the input and output control circuit I/O.

A decode circuit and a switch circuit which are not illustrated are connected to the cache memory CM. The decode circuit decodes a column address CA stored in the address register ADR (FIG. 4). The switch circuit causes the latch circuit XDL corresponding to the column address CA to be electrically connected to a bus DB (FIG. 4) according to an output signal of the decode circuit.

[Configuration of Sequencer SQC]

The sequencer SQC (FIG. 4) outputs an internal control signal to the row decoder RD, the sense amplifier module SAM, and the voltage generation circuit VG according to command data $D_{CMD}$ stored in the command register CMR. The sequencer SQC appropriately outputs status data $D_{ST}$ indicating a state of the memory die MD to a status register STR.

The sequencer SQC generates a ready/busy signal and outputs the ready/busy signal to a terminal RY//BY. Access to the memory die MD is basically prohibited during a period (busy period) in which a signal of the terminal RY//BY is in the "L" state. The access to the memory die MD is permitted during a period (ready period) in which the signal of the terminal RY//BY is in the "H" state. The signal of the terminal RY//BY is implemented by, for example, the pad electrode P described with reference to FIGS. 2 and 3. The signal output from the terminal RY//BY may be referred to as a ready/busy signal RY//BY.

[Configuration of Input and Output Control Circuit I/O]

The input and output control circuit I/O includes: data signal input and output terminals DQ0 to DQ7; toggle signal input and output terminals DQS and /DQS; and an input circuit such as a comparator and an output circuit such as an off chip driver (OCD) circuit connected to the data signal input and output terminals DQ0 to DQ7. The input and output circuit I/O includes a shift register connected to the input circuit and the output circuit, and a buffer circuit. The input circuit, the output circuit, the shift register, and the buffer circuit are respectively connected to terminals to which a power supply voltage $V_{CCQ}$ and the ground voltage $V_{SS}$ are supplied. The data signal input and output terminals DQ0 to DQ7, the toggle signal input and output terminals DQS and /DQS, and the terminal to which the power supply voltage $V_{CCQ}$ is supplied are implemented by, for example, the pad electrode P described with reference to FIGS. 2 and 3.

Data input via the data signal input and output terminals DQ0 to DQ7 is output from the buffer circuit to the cache memory CM, the address register ADR, or the command register CMR according to an internal control signal from the logic circuit CTR. Data output via the data signal input and output terminals DQ0 to DQ7 is input to the buffer circuit from the cache memory CM or the status register STR according to the internal control signal from the logic circuit CTR.

[Configuration of Logic Circuit CTR]

The logic circuit CTR (FIG. 4) receives an external control signal from the controller die CD via external control terminals /CEn, CLE, ALE, /WE, RE, and /RE, and outputs the internal control signal to the input and output control circuit I/O according thereto. The external control terminals /CEn, CLE, ALE, /WE, RE, and /RE are implemented by, for example, the pad electrode P described with reference to FIGS. 2 and 3.

The external control terminal /CEn is used when the memory die MD is selected. The input and output control circuit I/O of the memory die MD in which "L" is input to the external control terminal /CEn performs an input and an output of the data via the data signal input and output terminals DQ0 to DQ7. The input and output control circuit I/O of the memory die MD in which "H" is input to the external control terminal /CEn does not perform the input and output of the data via the data signal input and output terminals DQ0 to DQ7. A signal input to the external control terminal /CEn may be referred to as a chip enable signal /CEn.

The external control terminal CLE is used when the command register CMR is used. When "H" is input to the external control terminal CLE, the data input via the data signal input and output terminals DQ0 to DQ7 is stored in a buffer memory in the input and output control circuit I/O as the command data $C_{CMD}$, and transferred to the command register CMR. A signal input to the external control terminal CLE may be referred to as a command latch enable signal CLE.

The external control terminal ALE is used when the address register ADR is used. When "H" is input to the external control terminal ALE, the data input via the data signal input and output terminals DQ0 to DQ7 is stored in the buffer memory in the input and output control circuit I/O as the address data $D_{ADD}$, and transferred to the address register ADR. A signal input to the external control terminal ALE may be referred to as an address latch enable signal ALE.

When "L" is input to both the external control terminals CLE and ALE, the data DAT input via the data signal input and output terminals DQ0 to DQ7 is stored in the buffer memory in the input and output control circuit I/O as the user data, and transferred to the cache memory CM via the bus DB.

The external control terminal /WE is used when the data is input via the data signal input and output terminals DQ0 to DQ7. The data input via the data signal input and output terminals DQ0 to DQ7 is taken into the shift register in the input and output control circuit I/O at a timing of the voltage rise of the external control terminal /WE (switching of the input signal). A signal input to the external control terminal /WE may be referred to as a write enable signal /WE.

The toggle signal input and output terminals DQS and /DQS are used when the data via the data signal input and output terminals DQ0 to DQ7 is input. The data input via the data signal input and output terminals DQ0 to DQ7 is taken into the shift register in the input and output control circuit I/O at a timing of the voltage rise of the toggle signal input and output terminal DQS (switching of the input signal) and of the voltage fall of the toggle signal input and output terminal /DQS (switching of the input signal), and at a timing of the voltage fall of the toggle signal input and output terminal DQS (switching of the input signal) and of the voltage rise of the toggle signal input and output terminal /DQS (switching of the input signal). Signals input to the toggle signal input and output terminals DQS and /DQS may be referred to as data strobe signals DQS and /DQS.

When the data is input, the external control terminal /WE may be used, or the toggle signal input and output terminals DQS and /DQS may be used.

The external control terminals RE and /RE are used when the data via the data signal input and output terminals DQ0 to DQ7 is output. The data output via the data signal input and output terminals DQ0 to DQ7 is switched at a timing of the voltage fall of the external control terminal RE (switching of the input signal) and of the voltage rise of the external control terminal /RE (switching of the input signal), and a timing of the voltage rise of the external control terminal RE (switching of the input signal) and of the voltage fall of the external control terminal /RE (switching of the input signal). Signals input to the external control terminals RE and /RE may be referred to as read enable signals RE and /RE.

[Configuration of Address Register ADR]

As illustrated in FIG. 7, the address register ADR is connected to the input and output control circuit I/O via a path S101, and stores the address data $D_{ADD}$ input from the input and output control circuit I/O. The address register ADR includes, for example, register circuit sets RG101 and RG102 including six sets of 8-bit register columns including an 8-bit register circuit Register [7:0]. The 8-bit register circuit Register [7:0] may include, for example, eight latch circuits that store 1-bit data by using a pair of CMOS inverters. When an internal operation such as the read operation, the write operation, or the erasing operation is executed, the register circuit set RG101 stores the address data $D_{ADD}$ corresponding to the internal operation being executed. For example, when the write operation or the erasing operation is temporarily suspended and the read operation is executed, the register circuit set RG102 may be used to temporarily store the address data $D_{ADD}$ corresponding to the write operation or the erasing operation.

[Configuration of Command Register CMR]

The command register CMR is connected to the input and output control circuit I/O via a path S102, and stores the command data $D_{CMD}$ input from the input and output control circuit I/O. The command register CMR includes, for example, a register circuit set RG103 including one set of an 8-bit register column including an 8-bit register circuit Register [7:0]. The 8-bit register circuit Register [7:0] may include, for example, eight latch circuits that store 1-bit data by using a pair of CMOS inverters. When the command data $D_{CMD}$ is stored in the command register CMR, the control signal is transmitted to the sequencer SQC via a path S108, or the control signal is transmitted to the queue register control circuit QRC via a path S107.

[Configuration of Queue Register QR]

The queue register QR is connected to the address register ADR via a path S103 and a path S104, and is connected to the command register CMR via a path S105 and a path S106, thereby bidirectionally performing the input and output of data with respect to the address register ADR and the command register CMR.

The path S103 and the path S105 are routes for transferring the data from the address register ADR and the command register CMR to the queue register QR.

The path S104 and the path S106 are routes for transferring the data from the queue register QR to the address register ADR and the command register CMR.

Configurations of the paths S103, S104, S105, and S106 may be changed. For example, the paths S103, S104, S105, and S106 may include: eight pieces of wiring for transferring the data; and a switch circuit such as an MOS transistor that goes into an ON state according to a Q set operation which will be described later and that goes into an OFF state according to a Q end operation which will be described later. The paths S103 and S104 may include a switch circuit such as an MOS transistor that goes into the ON state when the address data is transferred and that goes into the OFF state when the command data is transferred. The paths S105 and S106 may include a switch circuit such as an MOS transistor that goes into the OFF state when the address data is transferred and that goes into the ON state when the command data is transferred. The path S103 and the path S104 may have a common configuration. The path S105 and the path S106 may have a common configuration.

The queue register QR includes, for example, a register circuit set RG104 including ten sets of register columns of total 9 bits including an 8-bit register circuit Register [7:0] for storing address and command data and a 1-bit register circuit ADDnCMD for determining an address and a command. The 8-bit register circuit Register [7:0] may include, for example, eight latch circuits, each of which stores 1-bit data by using a pair of CMOS inverters. The 1-bit register circuit ADDnCMD may include, for example, one latch circuit that stores 1-bit data by using a pair of CMOS inverters.

The 8-bit register circuit Register [7:0] for storing the address and command data stores the 8-bit data forming the address data $D_{ADD}$ or the command data $D_{CMD}$. The 1-bit register circuit ADDnCMD for determining the address and the command stores the 1-bit data indicating whether the data stored in the 8-bit register circuit Register [7:0] for storing the address and command data is the address data or the command data. For example, when the data stored in the 8-bit register circuit Register [7:0] for storing the address and command data is the command data $D_{CMD}$, "H" is stored, and when the data stored therein is the address data $D_{ADD}$, "L" is stored.

When neither the address data nor the command data are stored in the register column, for example, the 8-bit register circuit Register [7:0] of the register column stores the same data as command data C999, and the 1-bit register circuit ADDnCMD of the register column stores "H". While it will be described later, the command data C999 corresponds to 8 bits of "H", and functions as a reset command.

A data storage operation in the queue register QR is a first in first out (FIFO) operation, such that the data input first is output first. A specific configuration of the queue register QR may be changed. The queue register QR may be configured as, for example, a shift register that updates data according to the rise of a signal line QueCLK. In this case, for example, the data stored from a first register column to a ninth register column is transferred from a second register column to a tenth register column according to the rise of the signal line QueCLK. In a state where the path S103 or the path S105 is open, the data stored in the address register ADR or the command register CMR is transferred to the first register column. In a state where neither the path S103 nor the path S105 is open, the data stored in the tenth register column is transferred to the first register column. In a state where the path S104 or the path S106 is open, the data stored in the tenth register column is transferred to the address register ADR or the command register CMR. However, even in the state where the path S104 or the path S106 is open, when the data stored in the tenth register column is the command data C999, the data is not transferred to either the address register ADR or the command register CMR.

A circuit that stores "H" or "L" in the 1-bit register circuit ADDnCMD depending on whether the data input to the queue register QR is the command data $D_{CMD}$ or the address data $D_{ADD}$, may be provided between the queue register QR and the command register CMR, and/or between the queue register QR and the address register ADR. For example, the above-described circuit may be implemented by connecting a signal line that controls at least one of the switch circuit in the path S103 and the switch circuit in the path S105 to the 1-bit register circuit ADDnCMD, and may include the CMOS inverter whose input terminal is connected to the above-described signal line and whose output terminal is connected to the 1-bit register circuit ADDnCMD. For example, the queue register control circuit QRC may acquire a signal state of the external control terminal CLE and/or the external control terminal ALE from the logic circuit CTR, and may store "H" or "L" in the 1-bit register circuit ADDnCMD according to the signal state.

A circuit that connects the 8-bit register circuit Register [7:0] in the queue register QR to the 8-bit register circuit Register [7:0] in the command register CMR or the address register ADR depending on whether the data output from the queue register QR is the command data $D_{CMD}$ or the address data $D_{ADD}$, may be provided between the queue register QR and the command register CMR, and between the queue register QR and the address register ADR. For example, the above-described circuit may be implemented by connecting a signal line that controls the switch circuit in the path S104 and a signal line that controls the switch circuit in the path S106 to the 1-bit register circuit ADDnCMD, and may include the CMOS inverter whose output terminal is connected to the above-described signal line and whose input terminal is connected to the 1-bit register circuit ADDnCMD.

[Configuration of Queue Register Control Circuit QRC]

The queue register control circuit QRC is connected to the command register CMR via the path S107. The queue register control circuit QRC is configured to execute a Q set operation, a Q end operation, a Q execution operation, and a Q reset operation based upon the command data input from the command register CMR.

The Q set operation is an operation of opening the path S103 and the path S105 through a path S201 and of allowing the data to be transmitted from the command register CMR and the address register ADR to the queue register QR.

The Q end operation is an operation of blocking the path S103 and the path S105 through a path S202 and of preventing the data from being transmitted from the command register CMR and the address register ADR to the queue register QR.

The Q execution operation is an operation of opening the path S104 and the path S106 through a path S203 and of sequentially transferring all the data stored in the queue register QR to the command register CMR and the address register ADR.

The Q reset operation is an operation of erasing all the data stored in the queue register QR. When the Q reset operation is executed, the command data C999 is stored in all the 8-bit register circuits Register [7:0] in the queue register QR. "H" is stored in all the 1-bit register circuits ADDnCMD in the queue register QR.

Configurations of the paths S201 and S202 may be changed. For example, the path S201 and the path S202 may include one common wiring that is connected to the switch circuits in the path S103 and the path S105, that allows the switch circuits to go into a conductive state according to the execution of the Q set operation ("H" state when the switch circuits are formed of an NMOS transistor), and that allows the switch circuits to go into a non-conductive state according to the execution of the Q end operation ("L" state when the switch circuits are formed of the NMOS transistor). For example, the path S201 and the path S202 may include a flip-flop circuit, an RS flip-flop circuit, or other circuits in which an output terminal thereof is connected to the above-described wiring and an output signal is inverted according to an input of a rectangular wave.

A configuration of the path S203 may also be changed. For example, the path S203 may include one common wiring that is connected to the switch circuits in the paths S104 and S106, that allows the switch circuits to go into the conductive state according to the start of the Q execution operation ("H" state when the switch circuits are formed of the NMOS transistor), and that allows the switch circuits to go into the non-conductive state according to the end of the Q execution operation ("L" state when the switch circuits are formed of the NMOS transistor). For example, the path S203 may include the flip-flop circuit, the RS flip-flop circuit, or other circuits in which the output terminal thereof is connected to the above-described wiring and the output signal is inverted according to the input of the rectangular wave.

When the switch circuits in the path S103 and the path S104 have a common configuration, and when the switch circuits in the path S105 and the path S106 have a common configuration, a part or all of the configurations in the path S201 and the path S202 and a part or all of the configurations in the path S203 may be implemented to have a common configuration.

The queue register control circuit QRC is illustrated as an independent circuit in FIG. 7, and the queue register control circuit QRC may be configured as a part of the sequencer SQC.

[Read Operation]

Figure 8:
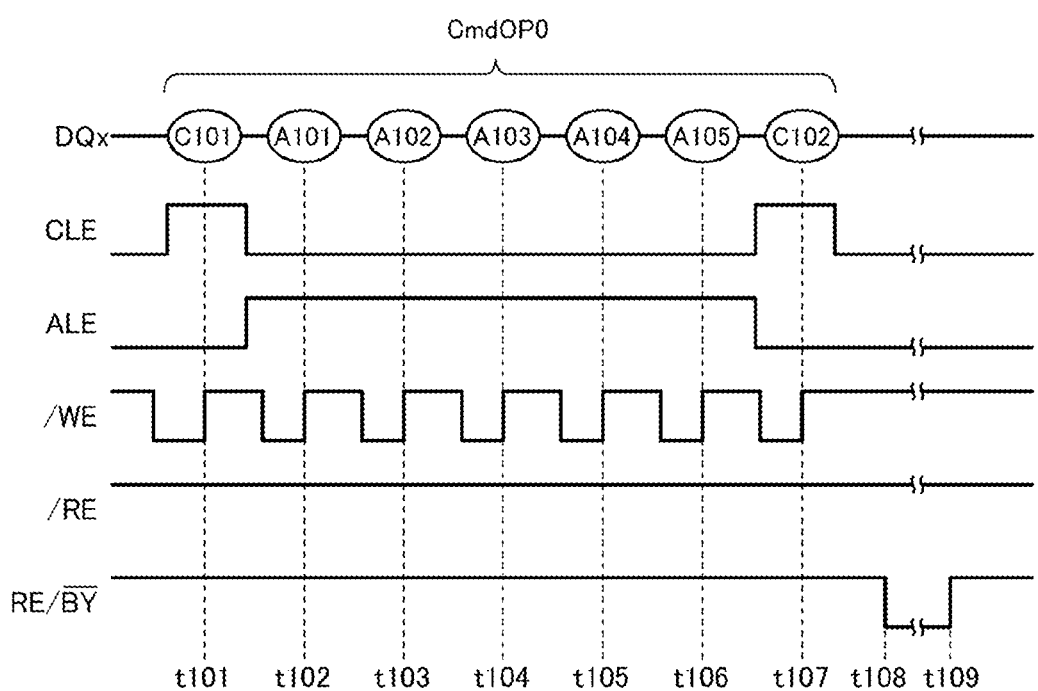
FIG. 8 is a timing chart illustrating an operation of the memory die MD.

Next, the read operation of the semiconductor storage device according to the embodiment will be described with reference to FIG. 8.

At a timing t101, the controller die CD inputs command data C101 as the command data $D_{CMD}$ to the memory die MD. The command data C101 is a command indicating the start of an input of a command set CmdOP0 corresponding to the read operation.

When data is input as the command data $D_{CMD}$, voltages of the data signal input and output terminals DQ0 to DQ7 are set to "H" or "L" according to each bit of the input data, and the external control terminal /WE is raised from "L" to "H" in a state where "H" is input to the external control terminal CLE and "L" is input to the external control terminal ALE. At this time, instead of raising a signal of the external control terminal /WE, signals of the toggle signal input and output terminals DQS and /DQS may be switched (toggled).

At timings t102, t103, t104, t105, and t106, the controller die CD inputs address data A101, A102, A103, A104, and A105 as the address data $D_{ADD}$ to the memory die MD.

When data is input as the address data $D_{ADD}$, the voltages of the data signal input and output terminals DQ0 to DQ7 are set to "H" or "L" according to each bit of the input data, and the external control terminal /WE is raised from "L" to "H" in a state where "L" is input to the external control terminal CLE and "H" is input to the external control terminal ALE. At this time, instead of raising the signal of the external control terminal /WE, the signals of the toggle signal input and output terminals DQS and /DQS may be switched (toggled).

The address data A101 to A105 include, for example, the column address CA (FIG. 4) and the row address RA (FIG. 4). The row address RA includes, for example, a block address that specifies the memory block BLK (FIG. 5), a page address that specifies the string unit SU and the word line WL, a plane address that specifies the memory cell array MCA, and a chip address that specifies the memory die MD.

At a timing t107, the controller die CD inputs command data C102 as the command data $D_{CMD}$ to the memory die MD. The command data C102 is a command indicating that the input of the command set corresponding to the read operation is completed.

At a timing t108, the signal of the terminal RY//BY changes from the "H" state to the "L" state, access to the memory die MD is prohibited, and the read operation commanded by the command set CmdOP0 is executed in the memory die MD. Accordingly, the data stored in the memory cell array MCA (FIG. 4) is read in the cache memory CM (FIG. 4).

At a timing t109, the read operation in the memory die MD is completed, the signal of the terminal RY//BY changes from the "L" state to the "H" state, and the access to the memory die MD is permitted.

[Write Operation]

Next, the write operation of the semiconductor storage device according to the embodiment will be described with reference to FIG. 9.

At a timing t111, the controller die CD inputs command data C111 as the command data $D_{CMD}$ to the memory die MD. The command data C111 is a command indicating the start of an input of a command set corresponding to the write operation.

At timings t112, t113, t114, t115, and t116, the controller die CD inputs address data A111, A112, A113, A114, and A115 as the address data $D_{ADD}$ to the memory die MD.

The address data A111 to A115 include, for example, the column address CA (FIG. 4) and the row address RA (FIG. 4). The row address RA includes, for example, the block address that specifies the memory block BLK (FIG. 5), the page address that specifies the string unit SU and the word line WL, the plane address that specifies the memory cell array MCA, and the chip address that specifies the memory die MD.

From a timing t117 to a timing before a timing t120, the controller die CD inputs data D111, D112, D113, ... as data DAT to the memory die MD. The data D111, D112, D113, ... are user data to be stored in the memory cell array MCA by the write operation.

When data is input as the data DAT, the voltages of the data signal input and output terminals DQ0 to DQ7 are set to "H" or "L" according to each bit of the input data, and the external control terminal /WE is raised from "L" to "H" in a state where "L" is input to the external control terminal CLE and "L" is input to the external control terminal ALE. At this time, instead of raising the signal of the external control terminal /WE, the signals of the toggle signal input and output terminals DQS and /DQS may be switched (toggled).

At the timing t120, the controller die CD inputs command data C112 as the command data $D_{CMD}$ to the memory die MD. The command data C112 is a command indicating that the input of a command set CmdOP1 corresponding to the write operation is completed.

At a timing t121, the signal of the terminal RY//BY changes from the "H" state to the "L" state, the access to the memory die MD is prohibited, and the write operation commanded by the command set CmdOP1 is executed in the memory die MD. Accordingly, the data D111, D112, D113, ... input from the timing t117 to the timing before the timing t120 are stored in the memory cell array MCA (FIG. 4).

At a timing t122, the write operation in the memory die MD is completed, the signal of the terminal RY//BY changes from the "L" state to the "H" state, and the access to the memory die MD is permitted.

At a timing t123, the controller die CD inputs command data C113 as the command data $D_{CMD}$ to the memory die MD. The command data C113 is a command corresponding to a status read operation. The status read operation is an operation of outputting the status data $D_{ST}$ (FIG. 4) from the memory die MD.

[Erasing Operation]

Figure 10:
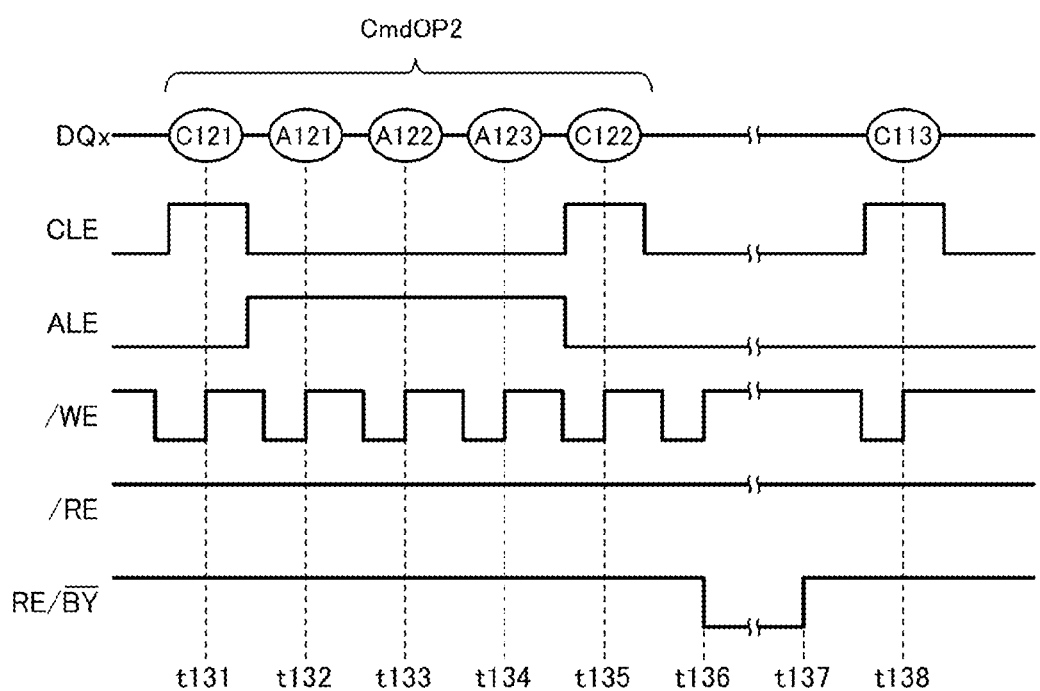
FIG. 10 is a timing chart illustrating the operation of the memory die MD.

Next, the erasing operation of the semiconductor storage device according to the embodiment will be described with reference to FIG. 10.

At a timing t131, the controller die CD inputs command data C121 as the command data $D_{CMD}$ to the memory die MD. The command data C121 is a command indicating the start of an input of a command set corresponding to the erasing operation.

At timings t132, t133, and t134, the controller die CD inputs address data A121, A122, and A123 as the address data $D_{ADD}$ to the memory die MD.

The address data A121 to A123 include, for example, the row address RA (FIG. 4). The row address RA includes, for example, the block address that specifies the memory block BLK (FIG. 5), the plane address that specifies the memory cell array MCA, and the chip address that specifies the memory die MD.

At a timing t135, the controller die CD inputs command data C122 as the command data $D_{CMD}$ to the memory die MD. The command data C122 is a command indicating that the input of the command set corresponding to the erasing operation is completed.

At a timing t136, the signal of the terminal RY//BY changes from the "H" state to the "L" state, the access to the memory die MD is prohibited, and the erasing operation commanded by a command set CmdOP2 is executed in the memory die MD. Accordingly, the data stored in the predetermined memory block BLK (FIG. 5) of the memory cell array MCA (FIG. 4) is erased.

At a timing t137, the erasing operation in the memory die MD is completed, the signal of the terminal RY//BY changes from the "L" state to the "H" state, and the access to the memory die MD is permitted.

At a timing t138, the controller die CD inputs the command data C113 as the command data $D_{CMD}$ to the memory die MD.

[Operation Using Queue Register QR]

Figure 11:
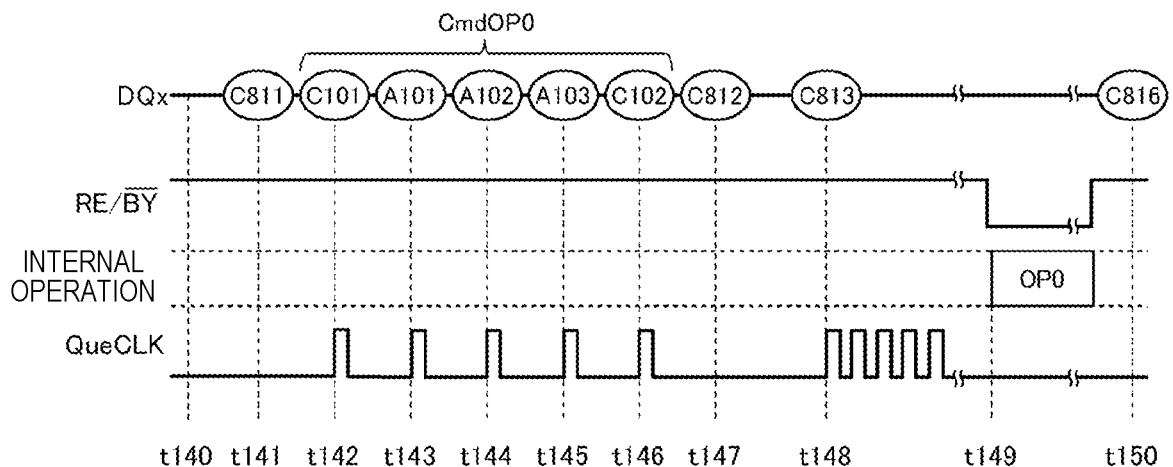
FIG. 11 is a timing chart illustrating the operation of the memory die MD.

Next, an example of an operation using the queue register QR of the semiconductor storage device according to the embodiment will be described with reference to FIG. 11. FIG. 11 is a timing chart illustrating an example of the above-described operation, and a schematic diagram illustrating data stored in the queue register QR when the above-described operation is executed.

In the example of FIG. 11, command data C811 indicating the Q set operation and command data C812 indicating the Q end operation are input during a ready period (RY// BY="H"). Accordingly, the command set CmdOP0 described with reference to FIG. 8 is stored in the queue register QR. Next, command data C813 indicating the Q execution operation is input. Accordingly, the command set CmdOP0 stored in the queue register QR is transferred to the command register CMR and the address register ADR, and the read operation (internal operation OP0) is executed. When command data C816 indicating the Q reset operation is input, the command set CmdOP0 stored in the queue register QR is erased.

Hereinafter, the operation thereof will be described with reference to the timing chart in FIG. 11.

At a timing t140, the signal of the terminal RY//BY is in the "H" state. At the timing t140, the command data C999 is stored in the 8-bit register circuit Register [7:0] corresponding to all the register columns in the queue register QR, and "H" is stored in the 1-bit register circuit ADDnCMD corresponding to all register columns.

At a timing t141, the controller die CD inputs the command data C811 indicating the Q set operation as the command data $D_{CMD}$ to the memory die MD. The command data C811 is input to the register circuit set RG103 in the command register CMR through the path S102 (FIG. 7).

When the command data C811 is input to the command register CMR, the queue register control circuit QRC is controlled through the path S107. The queue register control circuit QRC performs the Q set operation via the path S201, and opens the path S103 and the path S105 (FIG. 7).

At a timing t142, the controller die CD inputs the command data C101 as the command data $D_{CMD}$ to the memory die MD. Here, at the timing t142, the path S103 and the path S105 are open. When the command data C101 is input in this state, a pulse signal is input once to the signal line QueCLK of the semiconductor storage device. Accordingly, the command data C101 input to the command register CMR is transferred to the 8-bit register circuit Register [7:0] corresponding to the first register column in the queue register QR through the path S105. At this time, since the command data C101 is the command data $D_{CMD}$, "H" is stored in the 1-bit register circuit ADDnCMD for determining the address and the command.

At a timing t143, the controller die CD inputs the address data A101 as a part of the address data $D_{ADD}$, to the memory die MD. Here, at the timing t142, the path S103 and the path S105 are open. In this state, when the address data A101 is input thereto, the pulse signal is input once to the signal line QueCLK of the semiconductor storage device. Accordingly, the address data A101 input to the address register ADR is transferred to the 8-bit register circuit Register [7:0] corresponding to the first register column in the queue register QR through the path S103. At this time, since the address data A101 is the address data $D_{ADD}$, "L" is stored in the 1-bit register ADDnCMD for determining the address and the command. The command data C101 and "H" stored in the first register column are transferred to the second register column.

At a timing t144, the controller die CD inputs the address data A102 as a part of the address data $D_{ADD}$, to the memory die MD. Accordingly, the address data A102 and "L" are stored in the first register column of the queue register QR, the address data A101 and "L" are stored in the second register column thereof, and the command data C101 and "H" are stored in the third register column thereof.

At a timing t145, the controller die CD inputs the address data A103 as a part of the address data $D_{ADD}$, to the memory die MD. Accordingly, the address data A103 and "L" are stored in the first register column of the queue register QR, the address data A102 and "L" are stored in the second register column thereof, the address data A101 and "L" are stored in the third register column thereof, and the command data C101 and "H" are stored in the fourth register column thereof.

At a timing t146, the controller die CD inputs the command data C102 as the command data $D_{CMD}$ to the memory die MD. Accordingly, the command data C112 and "H" are stored in the first register column of the queue register QR, the address data A113 and "L" are stored in the second register column thereof, the address data A112 and "L" are stored in the third register column thereof, the address data A111 and "L" are stored in the fourth register column thereof, and the command data C111 and "H" are stored in the fifth register column thereof.

At a timing t147, the controller die CD inputs the command data C812 indicating the Q end operation as the command data $D_{CMD}$ to the memory die MD.

When the command data C812 is input to the command register CMR, the queue register control circuit QRC is controlled through the path S107. The queue register control circuit QRC performs the Q end operation via the path S202, and shuts off the path S103 and the path S105 (FIG. 7).

At a timing t148, the controller die CD inputs the command data C813 indicating the Q execution operation as the command data $D_{CMD}$ to the memory die MD. The command data C813 is input to the register circuit set RG103 in the command register CMR through the path S102 (FIG. 7).

When the command data C813 is input to the command register CMR, the queue register control circuit QRC is controlled through the path S107. The queue register control circuit QRC opens the path S104 and the path S106 via the path S203. The pulse signal is input to the signal line QueCLK of the semiconductor storage device ten times. When the pulse signal is input thereto once, the data stored in the tenth register column of the queue register QR is transferred to the command register CMR or the address register ADR and the first register column of the queue register QR. However, the command data C999 among the data stored in the queue register QR is not transferred to the command register CMR. When the pulse signal is input thereto once, the data stored in the first to the ninth register columns of the queue register QR is transferred to the second to the tenth register columns of the queue register QR. Therefore, in the example illustrated in the drawing, when the pulse signal is input thereto ten times, the command data C101 stored in the fifth register column to the command data C102 stored in the first register column are sequentially transferred to the command register CMR or the address register ADR, and at a timing t149, the read operation (internal operation OP0) is executed.

Figure 9:
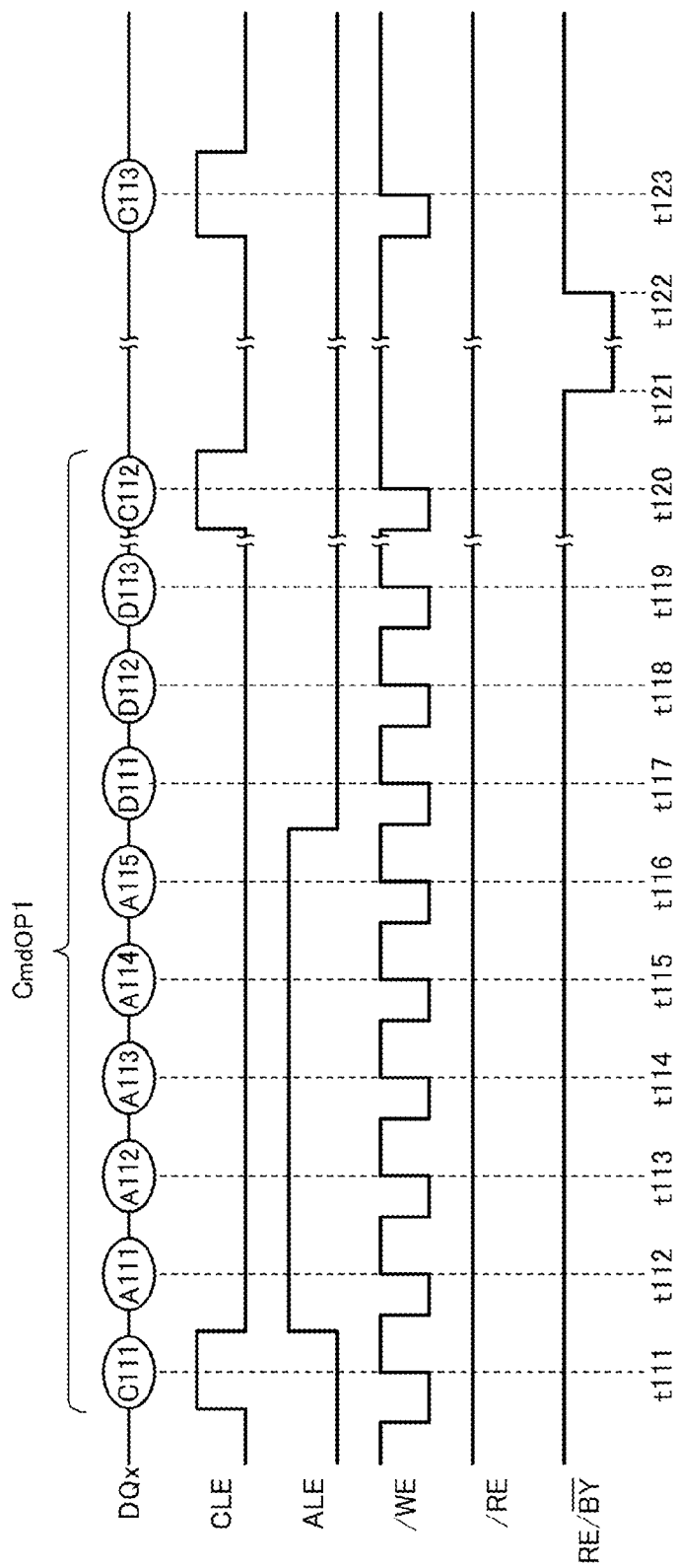
FIG. 9 is a timing chart illustrating the operation of the memory die MD.

After the read operation has been started, the status read operation may be executed in response to the command data C113 (FIG. 9). In the embodiment, whether or not the data is stored in the queue register QR can be checked through the status read operation executed in response to input of the command data C113 (FIG. 9).

For example, as illustrated in FIG. 11, at a timing t150 after the read operation (internal operation OP0) is completed, the controller die CD inputs the command data C816 indicating the Q reset operation as the command data $D_{CMD}$ to the memory die MD. When the command data C816 is input thereto, the command data C999 is stored in all the 8-bit register circuits Register [7:0] in the queue register QR, and "H" is stored in all the 1-bit register circuits ADDnCMD in the queue register QR.

The data stored in the queue register QR is stored in the queue register QR until the Q reset operation is executed. Therefore, for example, as illustrated in FIG. 12, at the timing t149 after the timing t148, when the command data C813 is input again, the read operation (internal operation OP0) is executed again.

Even in the case of the timing after the command data C811 is input and before the command data 812 is input, when the command data C999 is input to the semiconductor storage device, a reset operation is executed by the sequencer SQC. For example, in the example of FIG. 13, at such a timing t151, the command data C999 indicating a reset operation is input as the command data $D_{CMD}$. In this example, the command data C999 is not transferred to the queue register QR, but is stored in the register circuit set RG103 in the command register CMR. In response to the command data C999 having stored in the register circuit set RG103 in the command register CMR, the reset operation is executed by the sequencer SQC. Accordingly, for example, even when it is necessary to stop halfway storing the command set into the queue register QR, the reset operation can be executed immediately by the sequencer SQC, thereby making it possible to improve reliability of the operation of the memory die MD.

FIGS. 11 to 13 illustrate an example in which the command set CmdOP0 corresponding to the read operation is stored in the queue register QR. However, the queue register QR may store a part or all of another command set such as a part of the command set CmdOP1 corresponding to the write operation or the command set CmdOP2 corresponding to the erasing operation.

Figure 14:
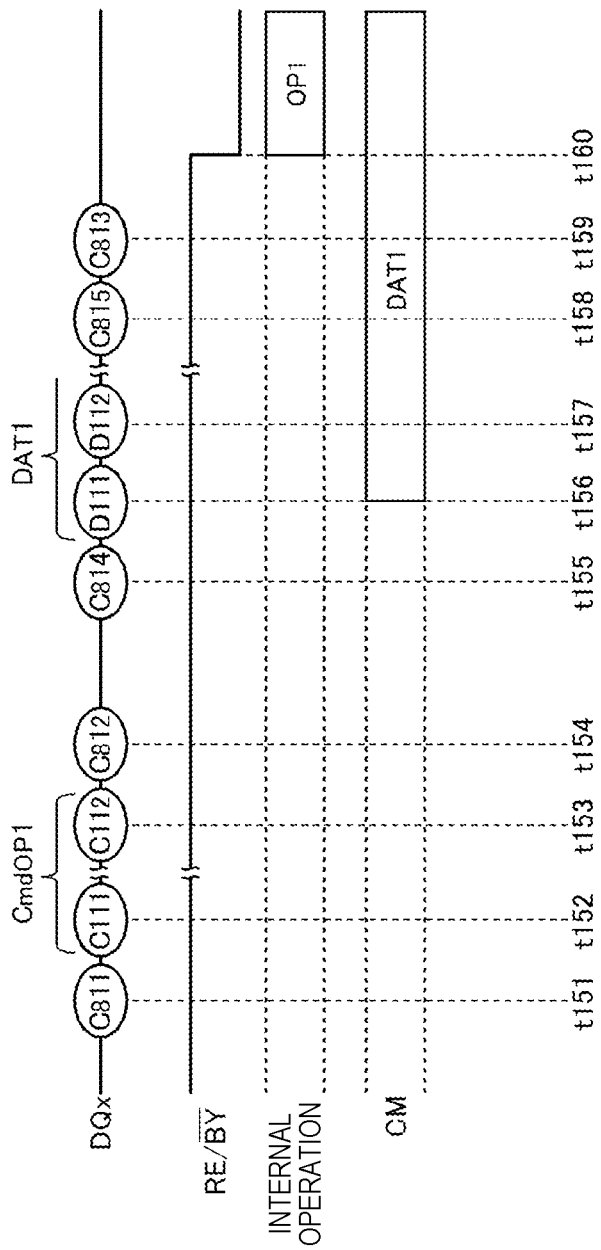
FIG. 14 is a timing chart illustrating the operation of the memory die MD.

For example, in an example of FIG. 14, the command data C811 indicating the Q set operation is input at the timing t151, the command set CmdOP1 is input from a timing t152 to a timing t153, and the command data C812 indicating the Q end operation is input at a timing t154. Here, in the embodiment, in the command set CmdOP1 (FIG. 9), only the command data C111 and the command data C112 corresponding to the command data, and the address data A111 to A115 corresponding to the address data are stored in the queue register QR, and data DAT1 (data D111, D112, D113, ...) is not stored in the queue register QR.

For example, in the example of FIG. 14, command data C814 indicating the start of the data input is input at a timing t155, the data DAT1 (data D111, D112, ...) in the command set CmdOP1 is input from a timing t156 to a timing before a timing t158, and command data C815 indicating the end of the data input is input at the timing t158. Here, in the embodiment, the data D111, D112, ... input from the timing t156 to the timing before the timing t158 are stored in the cache memory CM (FIG. 4).

For example, in the example of FIG. 14, the command data C813 indicating the Q execution operation is input at a timing t159. Accordingly, the write operation (internal operation OP1) starts at a timing t160.

[Effect]

According to the semiconductor storage device of the embodiment, the command set is stored in the queue register QR in advance, such that the same internal operation can be executed a plurality of times only by inputting the command for the Q execution operation. Therefore, for example, when the same internal operation is executed a plurality of times, the time required for inputting the command set to the memory die MD can be significantly reduced. As a result, it is possible to achieve a high-speed operation of the semiconductor storage device.

Second Embodiment

Figure 15:
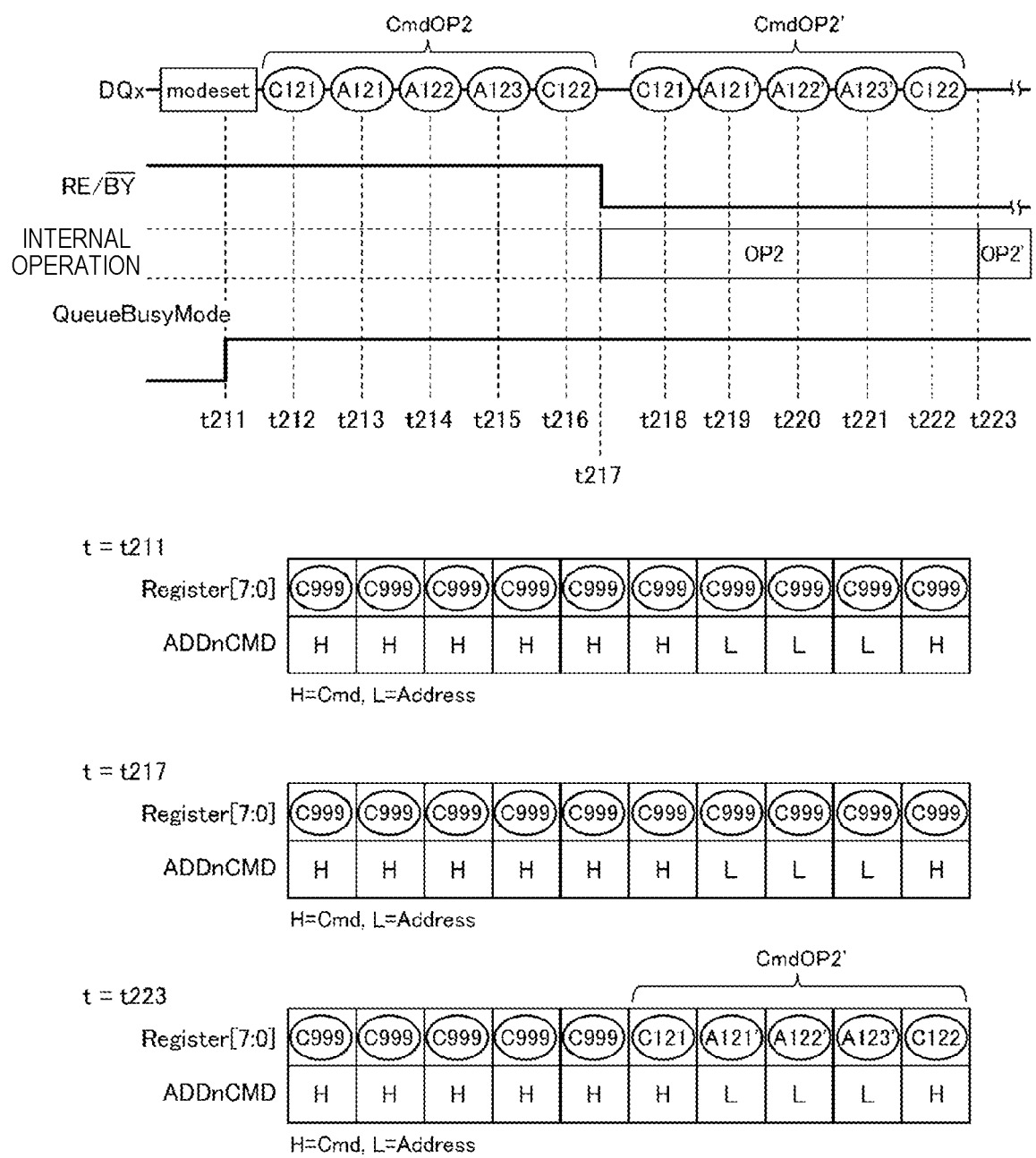
FIG. 15 is a timing chart illustrating an operation of a memory die according to a second embodiment.

Next, a semiconductor storage device according to a second embodiment will be described with reference to FIG. 15. FIG. 15 is a timing chart illustrating an operation of the semiconductor storage device according to the embodiment, and a schematic diagram illustrating data stored in the queue register QR when this operation is executed.

The semiconductor storage device according to the second embodiment is basically configured in the same manner as that of the semiconductor storage device according to the first embodiment. However, the queue register control circuit QRC according to the first embodiment is configured to execute the operation such as the Q set operation based upon the command data input from the command register CMR. On the other hand, a queue register control circuit according to the second embodiment is configured to automatically execute the operation such as the Q set operation according to a state of the semiconductor storage device.

For example, the semiconductor storage device according to the embodiment may be configured so that an operation mode that enables automatic execution such as the above-described Q set operation, and an operation mode that disables the automatic execution such as the above-described Q set operation can be selected by, for example, a set feature function. When enabling the automatic execution such as the Q set operation, for example, a set feature command set modeset for setting the operation mode is input to the memory die MD, thereby enabling "QueueBusyMode".

When the "QueueBusyMode" is enabled, and when the signal of the terminal RY//BY (ready busy signal) is in the "H" state, the input command set is transferred to the sequencer SQC via the command register CMR and the address register ADR, and a first internal operation in accordance with the command input by the sequencer SQC is executed. At this time, the input command set is not transferred to the queue register QR.

In the semiconductor storage device according to the embodiment, when the execution of the first internal operation starts, the signal of the terminal RY//BY falls from the "H" state to the "L" state. Accordingly, the Q set operation can be executed.

When the "QueueBusyMode" is enabled, and when the signal of the terminal RY//BY (ready busy signal) is in the "L" state, the input command set is transferred to the queue register QR via the command register CMR and the address register ADR, and stored in the queue register QR.

When the first internal operation being executed in the middle of inputting the command set is completed, the Q end operation and the Q execution operation are automatically executed, and a second internal operation corresponding to the command set stored in the queue register QR starts. After the execution of the Q execution operation, the Q reset operation may be automatically executed during the execution of the second internal operation. During the execution of the second internal operation, the signal of the terminal RY//BY is in the "L" state.

When the second internal operation is completed, the signal of the terminal RY//BY rises from the "L" state to the "H" state.

Hereinafter, the operation thereof will be described with reference to the timing chart in FIG. 15.

At a timing t211, the controller die CD inputs the set feature command set modeset as the command data $D_{CMD}$ to the memory die MD, and enables the "QueueBusyMode".

At a timing t212, the controller die CD inputs the command data C121 as the command data $D_{CMD}$ to the memory die MD. Here, at the timing t212, the signal of the terminal RY//BY is in the "H" state. Therefore, the command data C121 is not transferred to the queue register QR, but is stored in the command register CMR.

At timings t213, t214 and t215, the controller die CD inputs the address data A121, A122, and A123 as the address data $D_{ADD}$ to the memory die MD. Here, at the timings t213, 214, and 215, the signal of the terminal RY//BY is in the "H" state. Therefore, the address data A121, A122, and A123 are not transferred to the queue register QR, but are stored in the address register ADR.

At a timing t216, the controller die CD inputs the command data C122 as the command data $D_{CMD}$ to the memory die MD. Here, at the timing t216, the signal of the terminal RY//BY is in the "H" state. Therefore, the command data C122 is not transferred to the queue register QR, but is stored in the command register CMR.

At a timing t217, execution of an internal operation OP2 starts according to the command set CmdOP2. Accordingly, the signal of the terminal RY//BY enters the "L" state.

At a timing t218, the controller die CD inputs the command data C121 as the command data $D_{CMD}$ to the memory die MD. Here, at the timing t218, the signal of the terminal RY//BY is in the "L" state. Therefore, with the input of the command data C121, command data C221 and "H" are stored in the first register column of the queue register QR.

At timings t219, t220 and t221, the controller die CD inputs address data A121', A122', and A123' as the address data $D_{ADD}$ to the memory die MD. For example, the address data A121', A122', and A123' may specify addresses different from those of the address data A121, A122, and A123 input from the timing t213 to the timing t215. Here, at the timings t219, 220, and 221, the signal of the terminal RY//BY is in the "L" state. Therefore, with the input of the address data A121', A122', and A123', the address data A123' and "L" are stored in the first register column of the queue register QR, the address data A122' and "L" are stored in the second register column thereof, the address data A121' and "L" are stored in the third register column thereof, and the command data C121 and "H" are stored in the fourth register column thereof.

At a timing t222, the controller die CD inputs the command data C122 as the command data $D_{CMD}$ to the memory die MD. Here, at the timing t222, the signal of the terminal RY//BY is in the "L" state. Therefore, with the input of the command data C122, the command data C122 and "H" are stored in the first register column of the queue register QR, the address data A123' and "L" are stored in the second register column thereof, the address data A122' and "L" are stored in the third register column thereof, the address data A121' and "L" are stored in the fourth register column thereof, and the command data C121 and "H" are stored in the fifth register column thereof.

At a timing t223, the execution of the internal operation OP2 is completed. Accordingly, the Q end operation and the Q execution operation are automatically executed, and execution of an internal operation OP2' corresponding to a command set CmdOP2' stored in the queue register QR starts.

In the example of FIG. 15, the Q execution operation is executed at the timing when the execution of the internal operation OP2 is completed, and the timing at which the Q execution operation is executed may be a timing immediately before the execution of the internal operation OP2 is completed. The above-described timing may be, for example, a predetermined timing in a period during which the execution of the internal operation OP2 is substantially completed, and a voltage of the wiring in the memory cell array MCA is returned to a voltage when the internal operation is not executed (hereinafter referred to as a "recovery period").

[Effect]

According to the semiconductor storage device of the embodiment, it is not required to input the command data C811 and C812 in order to store the data in the queue register QR according to the signal of the terminal RY//BY. It is not required to input the command data C813 during the Q execution operation. Therefore, it is possible to input the command set to the queue register QR by inputting the same number of commands as that of a related art. Therefore, it is possible to achieve a high-speed operation of the semiconductor storage device.

According to the semiconductor storage device of the embodiment, it is possible to input the command set when the signal of the terminal RY//BY is in the "L" state. Therefore, it is possible to achieve a higher speed operation of the semiconductor storage device in comparison with a case where the command set is input after waiting for the signal of the terminal RY//BY to rise to the "H" state.

Third Embodiment

Figure 16:
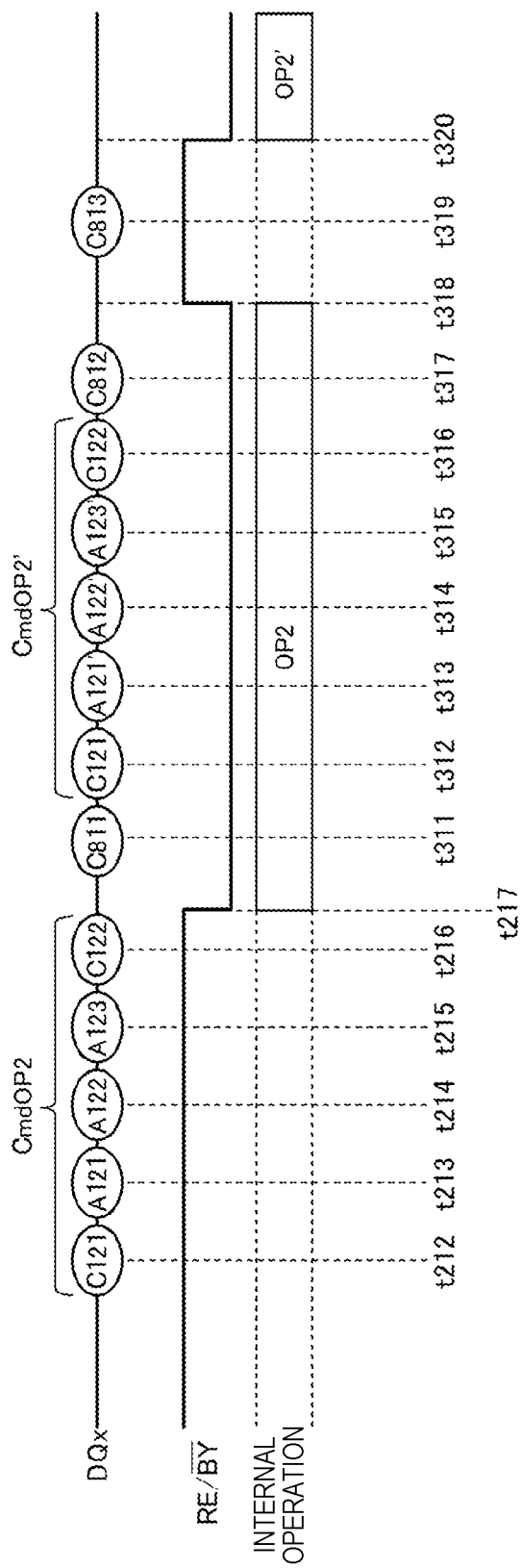
FIG. 16 is a timing chart illustrating an operation of a memory die according to a third embodiment.

Next, a semiconductor storage device according to a third embodiment will be described with reference to FIG. 16. FIG. 16 is a timing chart illustrating an operation of the semiconductor storage device according to the embodiment.

The semiconductor storage device according to the third embodiment is basically configured in the same manner as that of the semiconductor storage device according to the first embodiment. However, the semiconductor storage device according to the first embodiment is configured so that the command set can be input to the queue register QR only during the ready period. On the other hand, the semiconductor storage device according to the third embodiment is configured so that the command set can be input to the queue register QR even during the busy period.

Hereinafter, the operation thereof will be described with reference to the timing chart in FIG. 16.

The operation illustrated in FIG. 16 is executed in the same manner as that of the operation illustrated in FIG. 15 up to the timing t217.

The command data C811 indicating the Q set operation is input at a timing t311, the command set CmdOP2' is input from a timing t312 to a timing t316, and the command data C812 indicating the Q end operation is input at a timing t317.

At a timing t318, the execution of the internal operation OP2 is completed. Accordingly, the signal of the terminal RY//BY rises from the "L" state to the "H" state.

At a timing t319, the controller die CD inputs the command data C813 indicating the Q execution operation as the command data $D_{CMD}$ to the memory die MD.

At a timing t320, the execution of the internal operation OP2' starts. With the start of the execution of the internal operation OP2', the signal of the terminal RY//BY falls from the "H" state to the "L" state.

In the embodiment, when the command set CmdOP1 indicating the write operation is input to the queue register QR, the data DAT1 corresponding to the write operation is separately input in the same manner as that of the example of FIG. 14.

Figure 17:
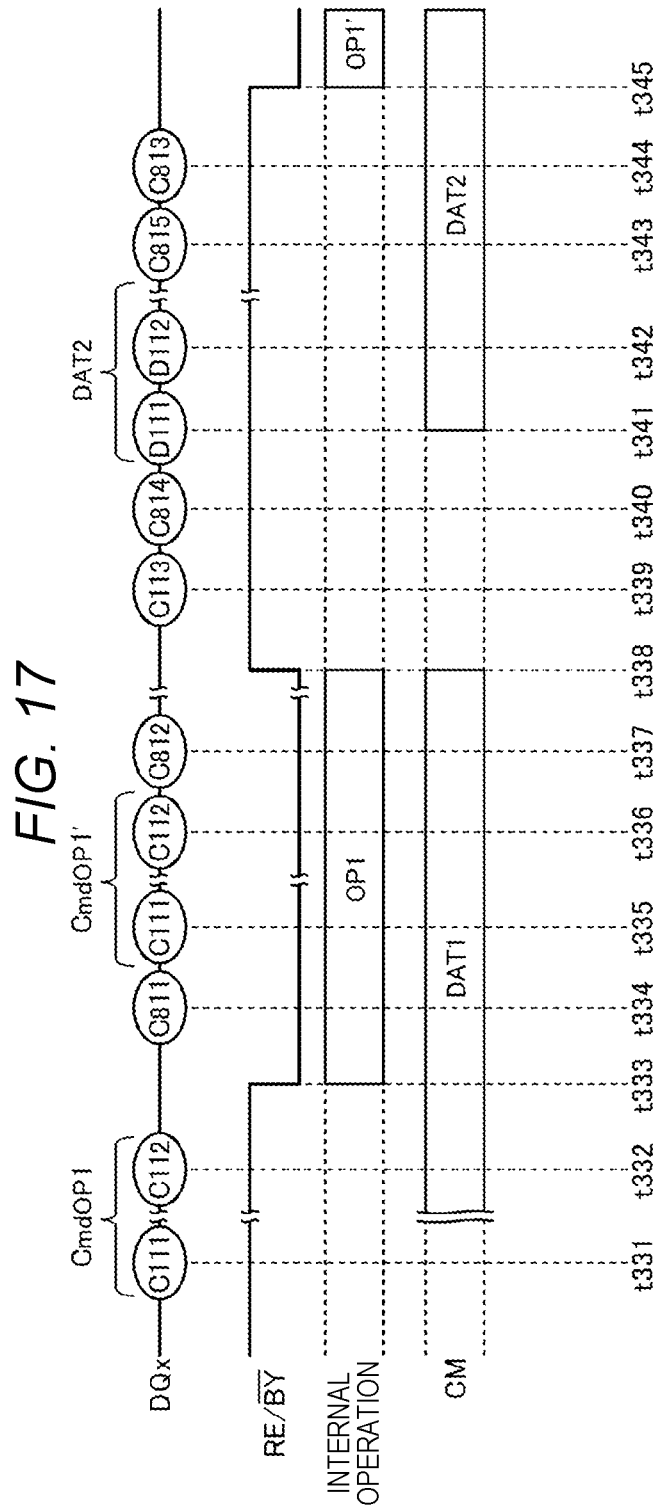
FIG. 17 is a timing chart illustrating the operation of the memory die according to the third embodiment.

For example, in an example of FIG. 17, the command set CmdOP1 is input from a timing t331 to a timing t332, and the write operation (internal operation OP1) starts at a timing t333. Accordingly, the signal of the terminal RY//BY falls from the "H" state to the "L" state.

For example, in the example of FIG. 17, the command data C811 indicating the Q set operation is input at a timing t334, command set CmdOP1' is input from a timing t335 to a timing t336, and the command data C812 indicating the Q end operation is input at a timing t337. Here, in the embodiment, in the command set CmdOP1', only the command data C111 and the command data C112 corresponding to the command data, and the address data A111 to A115 corresponding to the address data are stored in the queue register QR, and data DAT2 (data D111, D112, D113, . . . ) is not stored in the queue register QR.

For example, in the example of FIG. 17, the write operation (internal operation OP1) is completed at a timing t338, and the signal of the terminal RY//BY rises from the "L" state to the "H" state. The command data C113 indicating the status read operation is input at a timing t339.

For example, in the example of FIG. 17, the command data C814 indicating the start of the data input is input at a timing t340, the data DAT2 (data D111, D112, . . . ) in the command set CmdOP1' is input from a timing t341 to a timing before a timing t343, and the command data C815 indicating the end of the data input is input at the timing t343.

For example, in the example of FIG. 17, the command data C813 indicating the Q execution operation, is input at a timing t344. Accordingly, the write operation (internal operation OP1') starts at a timing t345. Accordingly, the signal of the terminal RY//BY falls from the "H" state to the "L" state.

[Effect]

According to the semiconductor storage device of the embodiment, it is possible to input the command set when the signal of the terminal RY//BY is in the "L" state. Therefore, it is possible to achieve a higher speed operation of the semiconductor storage device in comparison with the case where the command set is input after waiting for the signal of the terminal RY//BY to rise to the "H" state.

Fourth Embodiment

Figure 18:
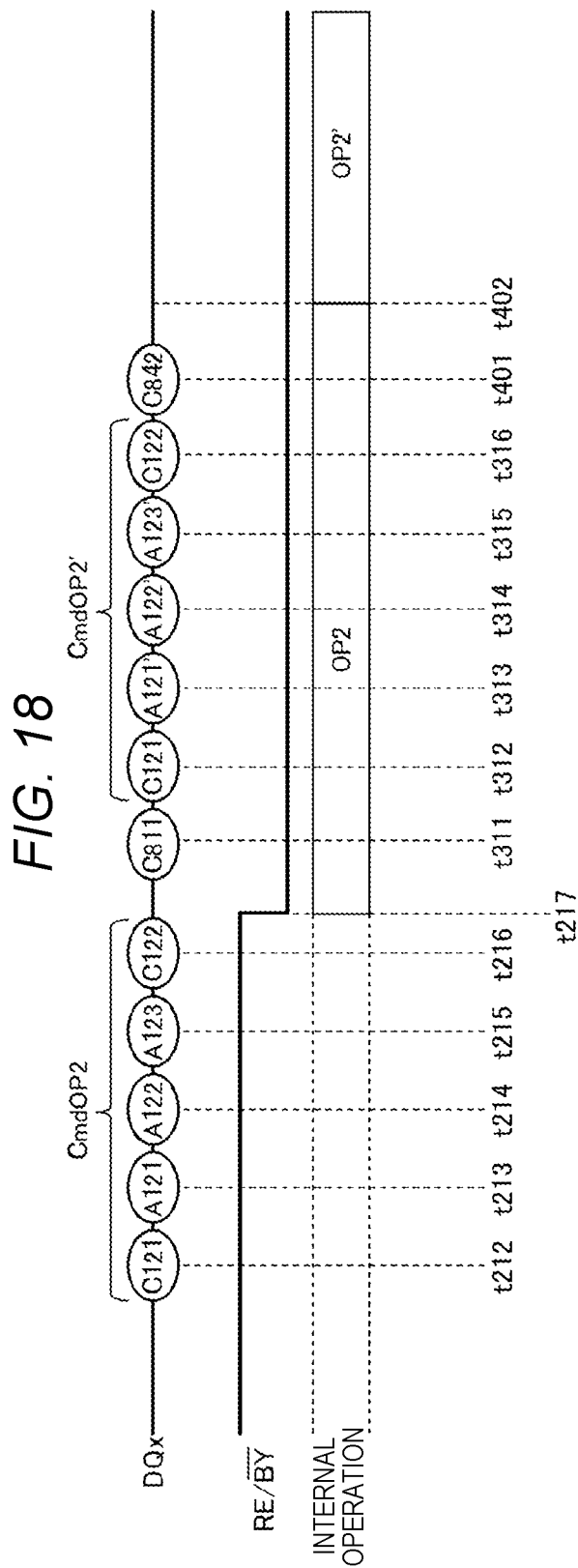
FIG. 18 is a timing chart illustrating an operation of a memory die according to a fourth embodiment.

Next, a semiconductor storage device according to a fourth embodiment will be described with reference to FIG. 18. FIG. 18 is a timing chart illustrating an operation of the semiconductor storage device according to the embodiment.

The semiconductor storage device according to the fourth embodiment is basically configured in the same manner as that of the semiconductor storage device according to the third embodiment. However, the semiconductor storage device according to the third embodiment is configured to execute the second internal operation by inputting the command data C813 during the ready period after the end of the first internal operation. On the other hand, the semiconductor storage device according to the fourth embodiment is configured to automatically execute the second internal operation after the end of the first internal operation by inputting command data C842 during the busy period, in the middle of the execution of the first internal operation.

Hereinafter, the operation thereof will be described with reference to the timing chart in FIG. 18.

The operation illustrated in FIG. 18 is executed in the same manner as that of the operation illustrated in FIG. 13 up to the timing t316.

At a timing t401, the controller die CD inputs the command data C842 as the command data $D_{CMD}$ instead of the command data C812 to the memory die MD. The command data C842 is a command indicating that the internal operation corresponding to the command data currently being input should be automatically executed, in response to the end of the internal operation currently being executed.

At a timing t402, the execution of the internal operation OP2 is completed. Accordingly, the Q execution operation is executed, and the execution of the internal operation OP2' starts.

In the example of FIG. 18, the Q execution operation is executed at the timing when the execution of the internal operation OP2 is completed, and the timing at which the Q execution operation is executed may be the timing immediately before the execution of the internal operation OP2 is completed. The above-described timing may be, for example, a predetermined timing in the recovery period.

[Effect]

According to the semiconductor storage device of the embodiment, after the internal operation currently being executed is completed, the operation corresponding to the command set stored in the queue register QR can be executed without inputting the command data C813 corresponding to the Q execution operation. Therefore, in comparison with the third embodiment, it is possible to achieve much higher speed operation of the semiconductor storage device.

For example, by adopting a mode in which both the operation illustrated in FIG. 16 and the operation illustrated in FIG. 18 can be executed by distinguishing between commands, it is possible to achieve improvement of operability of the semiconductor storage device.

Fifth Embodiment

Figure 19:
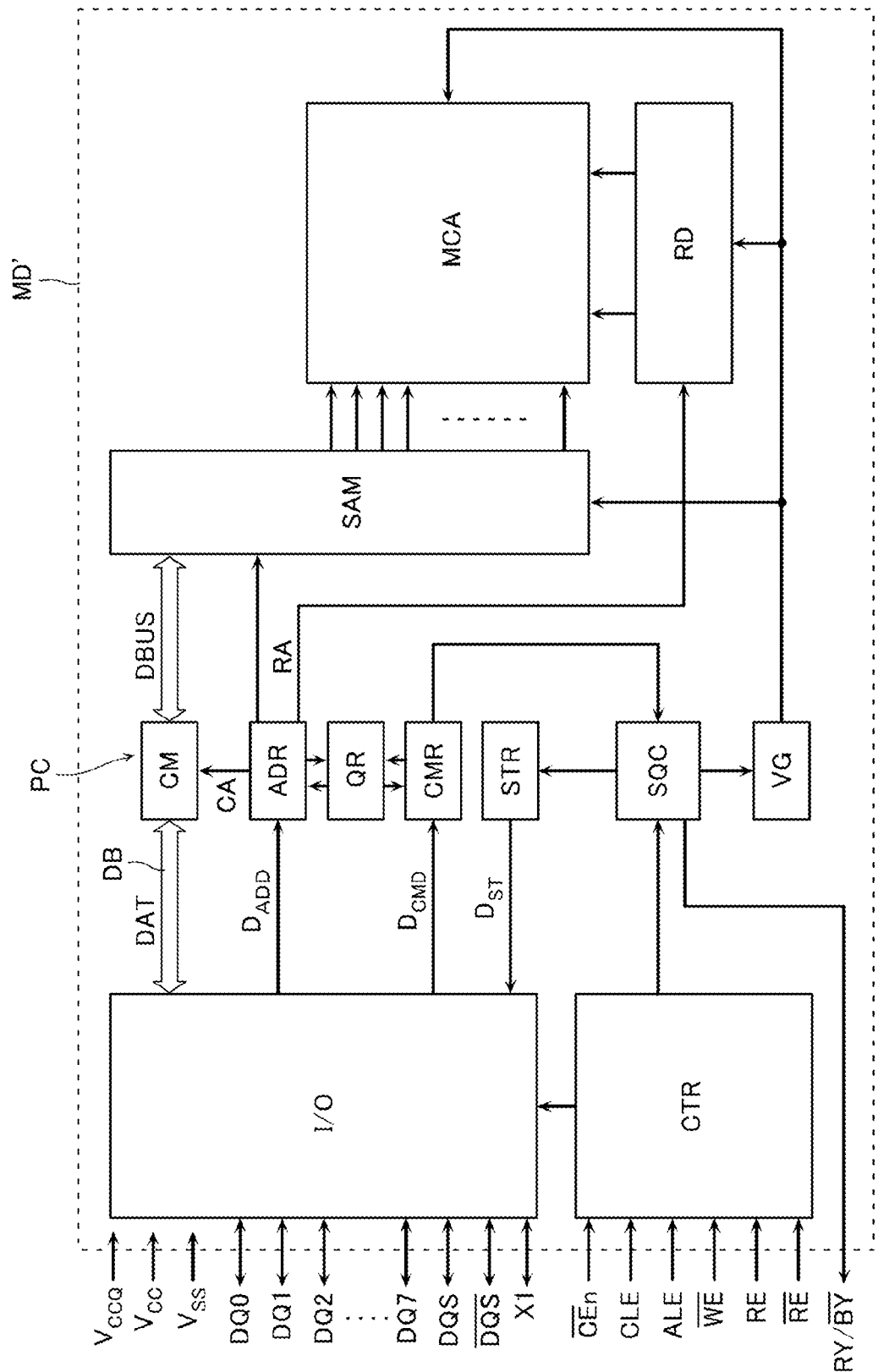
FIG. 19 is a schematic block diagram illustrating a configuration of a memory die MD' according to a fifth embodiment.

Next, a semiconductor storage device according to a fifth embodiment will be described with reference to FIG. 19. FIG. 19 is a schematic block diagram illustrating a configuration of a memory die MD' according to the embodiment.

The semiconductor storage device according to the fifth embodiment is basically configured in the same manner as that of the semiconductor storage device according to the first embodiment. However, as illustrated in FIG. 19, the input and output circuit I/O according to the fifth embodiment includes a data signal input terminal X1 in addition to the data signal input and output terminals DQ0 to DQ7 and the toggle signal input and output terminals DQS and /DQS. The data signal input terminal X1 is implemented by, for example, the pad electrode P described with reference to FIGS. 2 and 3. In the fifth embodiment, the data signal input terminal X1 is used when the command set is input to the queue register QR.

The data signal input terminal X1 is a terminal different from the data signal input and output terminals DQ0 to DQ7, which can receive an input even during the ready period and the busy period. The 8-bit data input via the data signal input and output terminals DQ0 to DQ7 is input in parallel from the controller die CD to the memory die MD'. That is, when the signal of the external control terminal /WE or the toggle signal input and output terminals DQS and /DQS is switched once, the 8-bit data is simultaneously input. On the other hand, the 8-bit data input via the data signal input terminal X1 is serially input from the controller die CD to the memory die MD. That is, each time the signal of the external control terminal /WE or the toggle signal input and output terminals DQS and /DQS is switched once, one bit is input in order.

Figure 20:
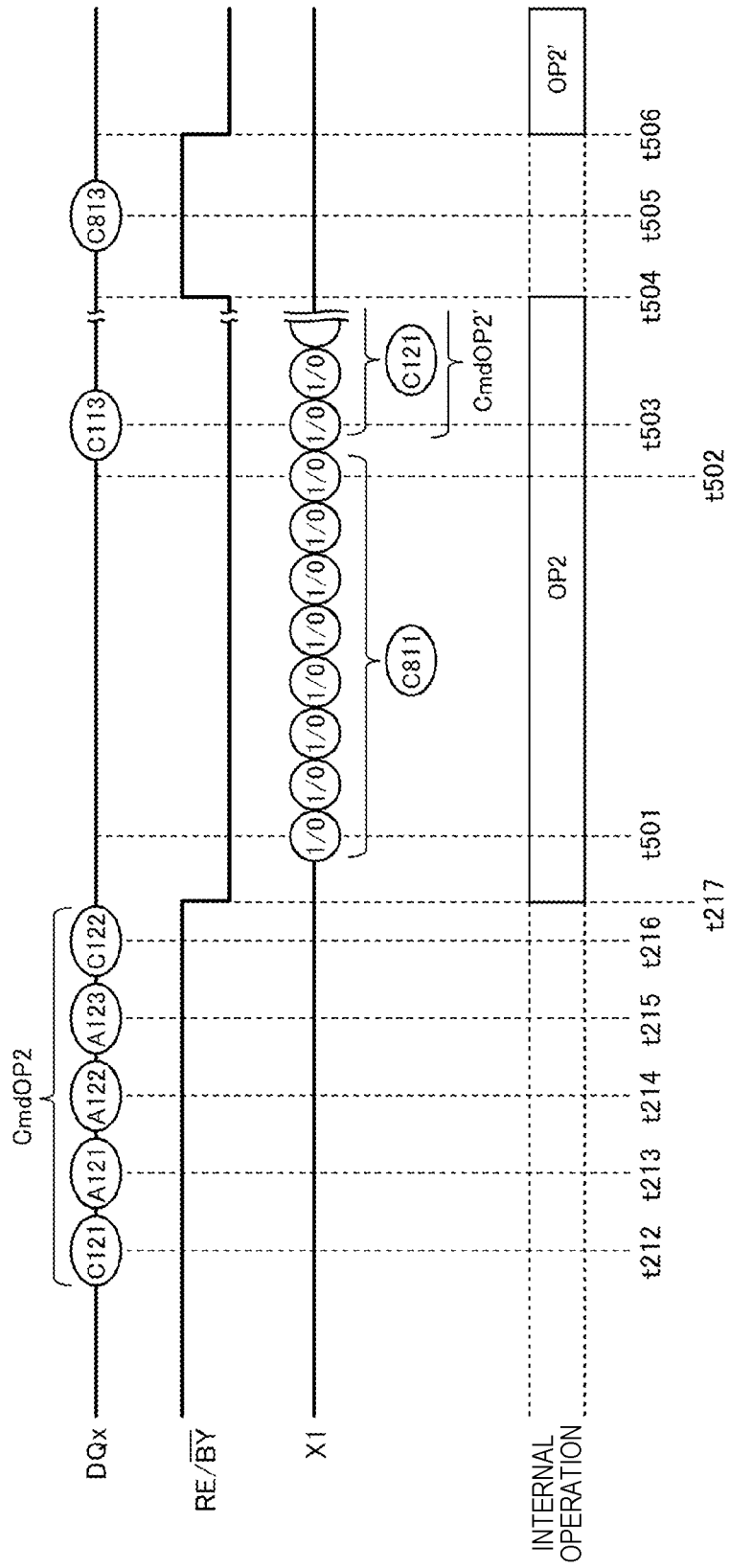
FIG. 20 is a timing chart illustrating an operation of the memory die MD' according to the fifth embodiment.

FIG. 20 is a timing chart illustrating an operation of the semiconductor storage device according to the embodiment.

Hereinafter, the operation thereof will be described with reference to the timing chart in FIG. 20.

The operation illustrated in FIG. 20 is executed in the same manner as that of the operation illustrated in FIG. 15 up to the timing t217.

From a timing t501 to a timing t502, 8-bit data forming the command data C811 is sequentially input bit by bit via the data signal input terminal X1.

From a timing t503 to a timing before a timing t504, data of 5×8 bits forming the command set CmdOP2' and data of 1×8 bits forming the command data C812 are sequentially input bit by bit via the data signal input terminal X1. In the example of FIG. 20, at the timing t503, the command data C113 indicating the status read operation is input.

At the timing t504, the execution of the internal operation OP2 is completed. With the end of the internal operation OP2, the signal of the terminal RY//BY rises from the "L" state to the "H" state.

At a timing t505, the controller die CD inputs the command data C813 indicating the Q execution operation as the command data $D_{CMD}$ to the memory die MD.

At a timing t506, the execution of the internal operation OP2' starts. With the start of the execution of the internal operation OP2', the signal of the terminal RY//BY falls from the "H" state to the "L" state.

The example of FIG. 20 assumes an example in which the command data C811, the command set CmdOP2', and the command data C812 are input via the data signal input terminal X1. However, the command data C842 may be input instead of inputting the command data C812. In this case, the timing at which the Q execution operation is executed may be the timing at which the execution of the internal operation OP2 is completed, or may be the timing immediately before the execution of the internal operation OP2 is completed.

The example illustrated in FIG. 20 shows an example in which the command set CmdOP2' is input by using the command data C811. However, for example, it is also possible to automatically transfer the command data $D_{CMD}$ and the address data $D_{ADD}$, input via the data signal input terminal X1 to the queue register QR.

[Effect]

According to the semiconductor storage device of the embodiment, the input of the command set stored in the queue register QR is executed via the data signal input terminal X1. Therefore, another operation such as the status read operation can be executed in parallel with the input of the command set stored in the queue register QR. Therefore, in comparison with the first embodiment, it is possible to achieve much higher speed operation of the semiconductor storage device.

Sixth Embodiment

Figure 21:
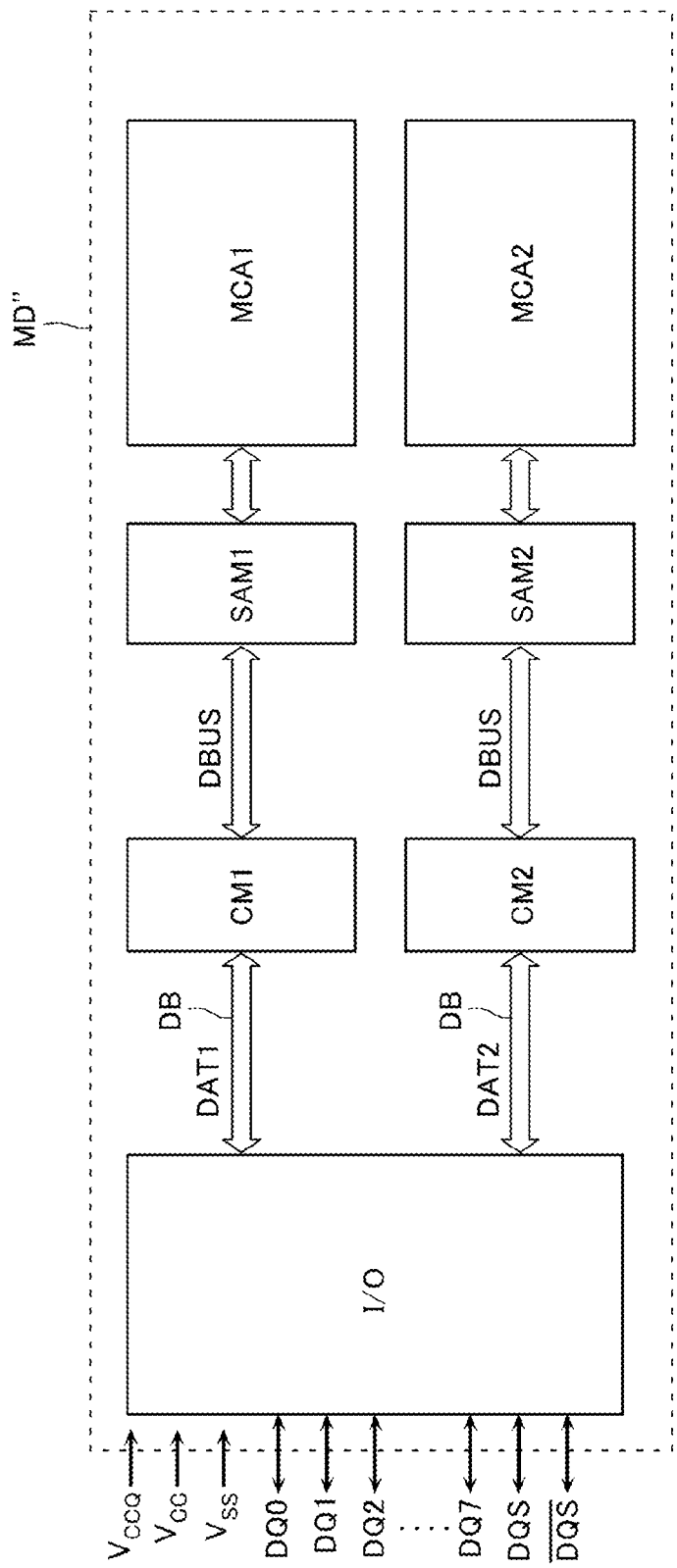
FIG. 21 is a schematic block diagram illustrating a configuration of a memory die MD" according to a sixth embodiment.

Next, a semiconductor storage device according to a sixth embodiment will be described with reference to FIG. 21. FIG. 21 is a schematic block diagram illustrating a configuration of a memory die MD" according to the embodiment.

The semiconductor storage device according to the sixth embodiment is basically configured in the same manner as that of the semiconductor storage device according to the first embodiment. However, as illustrated in FIG. 21, the memory die MD" according to the sixth embodiment includes: two memory cell arrays MCA1 and MCA2 corresponding to the memory cell array MCA described with reference to FIG. 4; two sense amplifier modules SAM1 and SAM2 corresponding to the sense amplifier module SAM; and two cache memories CM1 and CM2 corresponding to the cache memory CM. For example, the above-described plane addresses of the two memory cell arrays MCA1 and MCA2 are different from each other. The sense amplifier modules SAM1 and SAM2 are respectively connected to the memory cell arrays MCA1 and MCA2. The cache memories CM1 and CM2 are respectively connected to the sense amplifier modules SAM1 and SAM2. The input and output circuits I/O according to the embodiment are respectively connected to the cache memories CM1 and CM2.

Figure 22:
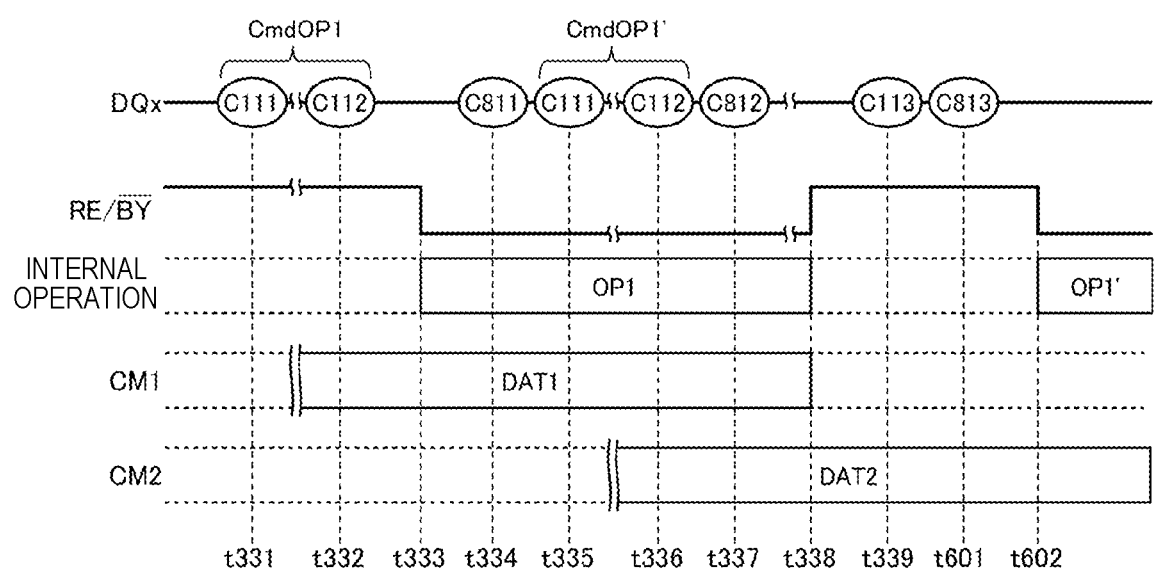
FIG. 22 is a timing chart illustrating an operation of the memory die MD" according to the sixth embodiment.

FIG. 22 is a timing chart illustrating an operation of the semiconductor storage device according to the embodiment, and a schematic diagram illustrating data stored in the cache memories CM1 and CM2 when this operation is executed.

As described with reference to FIG. 17, in the semiconductor storage device according to the third embodiment, when the command set CmdOP1' indicating the write operation is input to the queue register QR, in the command set CmdOP1', only the command data C111 and the command data C112 corresponding to the command data, and the address data A111 to A115 corresponding to the address data are stored in the queue register QR, and the data DAT2 (data D111, D112, D113, . . . ) is not stored in the queue register QR.

On the other hand, in the semiconductor storage device according to the sixth embodiment, when the command set CmdOP1' indicating the write operation is input to the queue register QR, it is determined whether or not a plane address in the command set CmdOP1' matches a plane address corresponding to the internal operation OP1 currently being executed. When the plane addresses match each other, the data DAT2 is separately input after the internal operation OP1 is executed, as described with reference to FIG. 17. When the plane addresses do not match each other, as illustrated in FIG. 22, the data DAT2 is stored in the cache memory CM1 or the cache memory CM2 corresponding to the command set CmdOP1'.

Hereinafter, the operation thereof will be described with reference to the timing chart in FIG. 22.

The operation illustrated in FIG. 22 is executed in the same manner as that of the operation illustrated in FIG. 17 up to the timing t339. However, unlike the operation illustrated in FIG. 17, the data DAT2 input between the timing t335 and the timing t336 is stored in the cache memory CM2.

At a timing t601, after the internal operation OP1 is completed, the command data C813 indicating the Q execution operation is input as the command data $D_{CMD}$ without inputting the data DAT2.

At a timing t602, the execution of the internal operation OP1' starts. Accordingly, the signal of the terminal RY//BY falls from the "H" state to the "L" state.

FIG. 22 illustrates an example in which the command set CmdOP1' indicating the write operation is input during the execution of the write operation. However, the above-described operation can be executed, for example, even when the command set CmdOP1' indicating the write operation is input during the execution of the read operation or the erasing operation. When the command set CmdOP1' indicating the write operation is input during the execution of the above-described erasing operation, it is possible to execute the same operation as the operation illustrated in FIG. 22 even when the plane addresses match each other.

The example illustrated in FIG. 22 assumes an example in which the command data C812 indicating the Q end operation is input after the command set CmdOP1' is executed. However, the command data C842 may be input instead of inputting the command data C812. In this case, the timing at which the Q execution operation is executed may be a timing at which the execution of the internal operation OP1 is completed, or may be a timing immediately before the execution of the internal operation OP1 is completed.

The example illustrated in FIG. 22 shows an example in which the command set CmdOP1' is input by using the command data C811. However, for example, the operation as described with reference to FIG. 22 may be executed in the operation mode as described with reference to FIG. 15. Even when the command set CmdOP1' is input by using the data signal input terminal X1 as described with reference to FIG. 19, the operation as described with reference to FIG. 22 may be executed.

Seventh Embodiment

Figure 23:
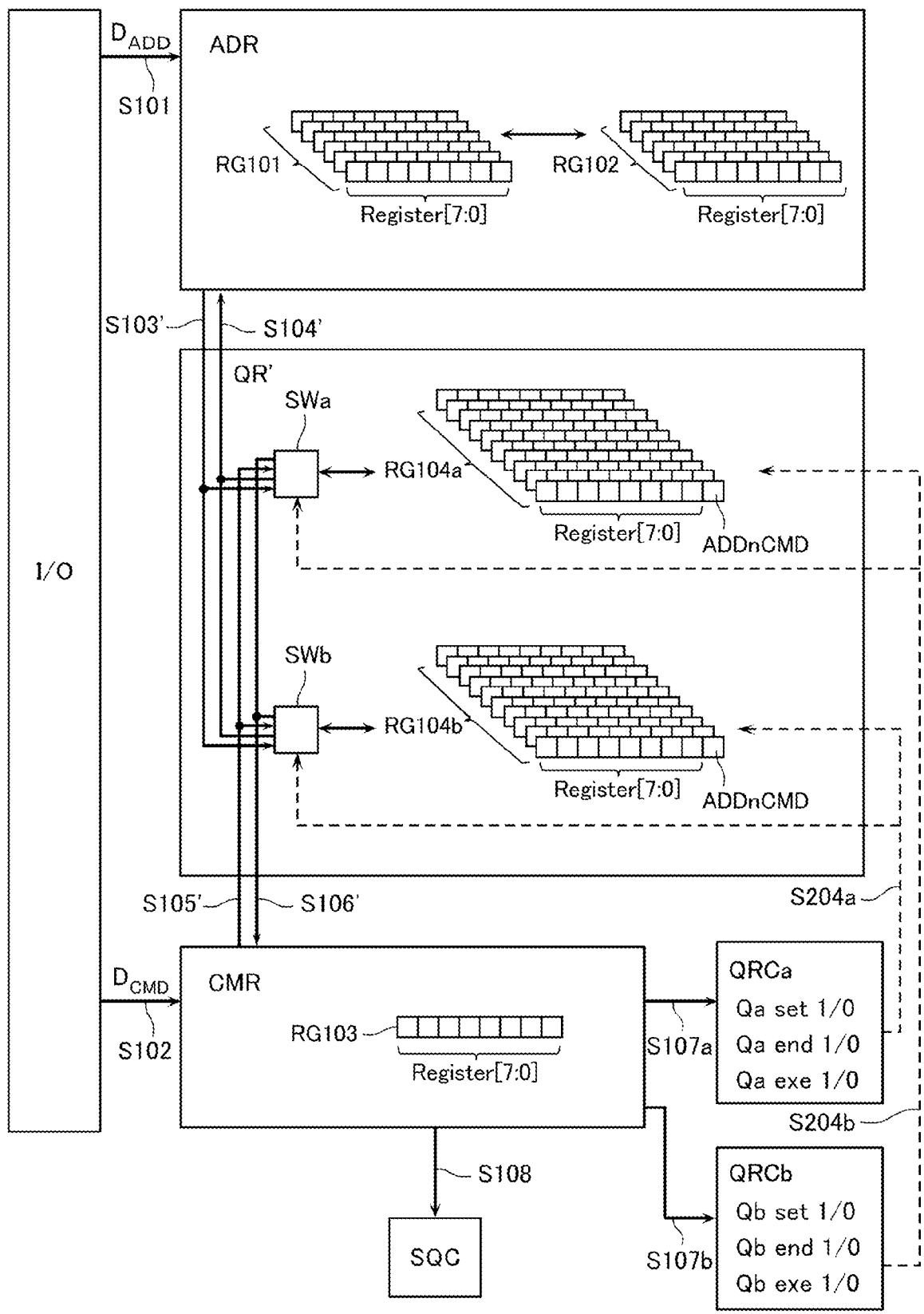
FIG. 23 is a schematic block diagram illustrating a partial configuration of a memory die according to a seventh embodiment.

Next, a semiconductor storage device according to a seventh embodiment will be described with reference to FIG. 23. FIG. 23 is a schematic block diagram illustrating a configuration of the semiconductor storage device according to the embodiment.

The semiconductor storage device according to the seventh embodiment is basically configured in the same manner as that of the semiconductor storage device according to the first embodiment. However, as illustrated in FIG. 23, the semiconductor storage device according to the seventh embodiment includes a queue register QR', queue register control circuits QRCa and QRCb instead of the queue register QR and the queue register control circuit QRC described with reference to FIG. 7.

The queue register QR' is connected to the address register ADR via a path S103' and a path S104', and is connected to the command register CMR via a path S105' and a path S106', thereby bidirectionally performing the input and output of data with respect to the address register ADR and the command register CMR.

The paths S103', S104', S105', and S106' are basically configured in the same manner as that of the paths S103, S104, S105, and S106 (FIG. 7). However, the paths S103', S104', S105', and S106' may be provided without the switch circuit described above for paths S103, S104, S105, and S106.

The queue register QR' includes two register circuit sets RG104a and RG104b instead of one register circuit set RG104 as described with reference to FIG. 7. The two register circuit sets RG104a and RG104b are respectively configured in the same manner as that of the register circuit set RG104 described with reference to FIG. 7.

The queue register QR' includes a switch circuit SWa provided between the register circuit set RG104a, and the paths S103', S104', S105', and S106'. The queue register QR' includes a switch circuit SWb provided between the register circuit set RG104b, and the paths S103', S104', S105', and S106'. The switch circuits SWa and SWb may include, for example, configurations corresponding to the switch circuits in the paths S103, S104, S105, and S106 (FIG. 7).

The queue register control circuits QRCa and QRCb are respectively configured in the same manner as that of the queue register control circuit QRC described with reference to FIG. 7. The queue register control circuits QRCa and QRCb are respectively connected to the command register CMR via paths S107a and S107b. The queue register control circuit QRCa is connected to the register circuit set RG104a and the switch circuit SWa via a path S204a. The queue register control circuit QRCb is connected to the register circuit set RG104b and the switch circuit SWb via a path S204b. The paths S204a and S204b respectively include configurations corresponding to the paths S201, S202, and S203 described with reference to FIG. 7.

Figure 24:
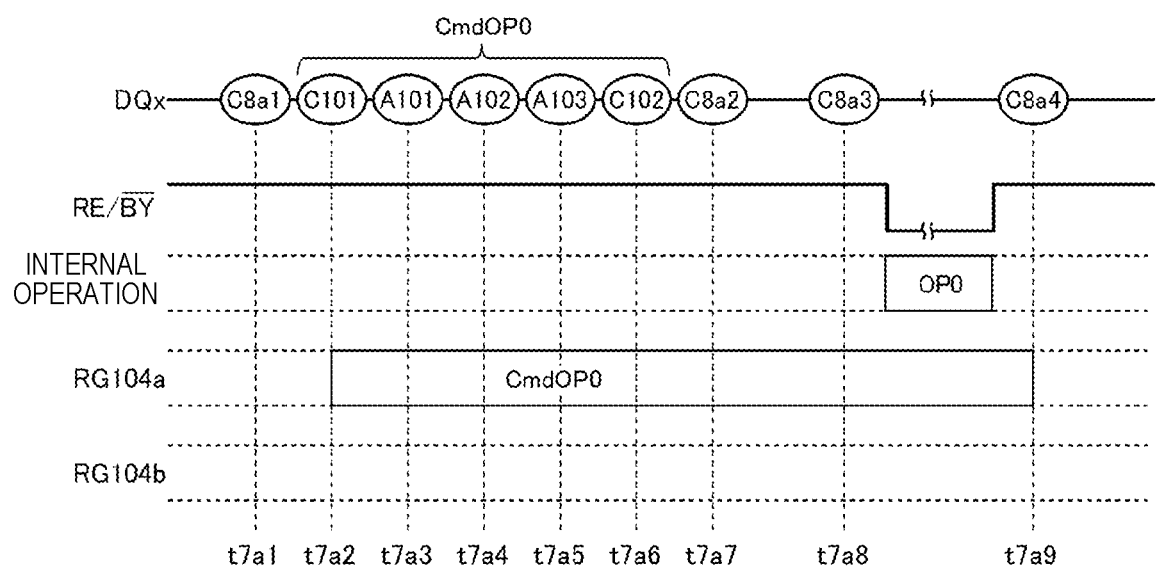
FIG. 24 is a timing chart illustrating an operation of the memory die according to the seventh embodiment.
Figure 25:
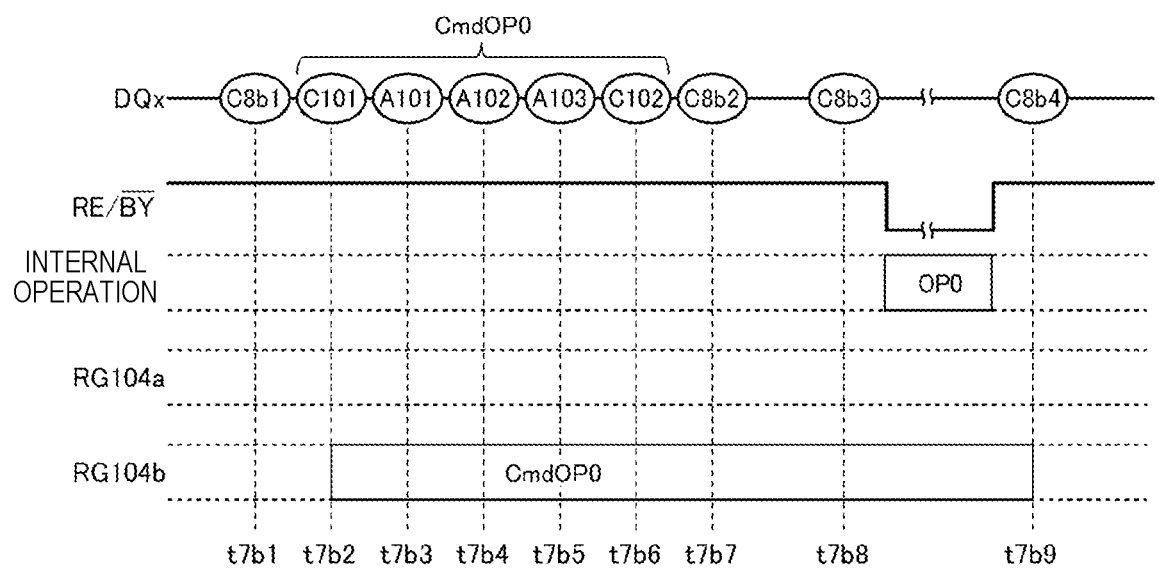
FIG. 25 is a timing chart illustrating the operation of the memory die according to the seventh embodiment.

FIGS. 24 and 25 are timing charts illustrating an operation of the semiconductor storage device according to the embodiment.

The semiconductor storage device according to the seventh embodiment basically operates in the same manner as that of the semiconductor storage device according to the first embodiment. However, the semiconductor storage device according to the seventh embodiment can independently execute the Q set operation, the Q end operation, the Q execution operation, and the Q reset operation with respect to the register circuit set RG104a, and the Q set operation, the Q end operation, the Q execution operation, and the Q reset operation with respect to the register circuit set RG104b.

For example, as illustrated in FIG. 24, the semiconductor storage device according to the seventh embodiment can execute the Q set operation with respect to the register circuit set RG104a by inputting command data C8a1, can execute the Q end operation with respect to the register circuit set RG104a by inputting command data C8a2, can execute the Q execution operation with respect to the register circuit set RG104a by inputting command data C8a3, and can execute the Q reset operation with respect to the register circuit set RG104a by inputting command data C8a4.

In the example of FIG. 24, the command data C8a1 is input at a timing t7a1, the command set CmdOP0 is input from a timing t7a2 to a timing t7a6, and the command data C8a2 is input at a timing t7a7. As a result, the command set CmdOP0 is stored in the register circuit set RG104a. In the example of FIG. 24, the command data C8a3 is input at a timing t7a8, whereby the read operation (internal operation OP0) starts. In the example of FIG. 24, the command data C8a4 is input at a timing t7a9, whereby the command set CmdOP0 stored in the register circuit set RG104a is erased.

For example, as illustrated in FIG. 25, the semiconductor storage device according to the seventh embodiment can execute the Q set operation with respect to the register circuit set RG104b by inputting command data C8b1, can execute the Q end operation with respect to the register circuit set RG104b by inputting command data C8b2, can execute the Q execution operation with respect to the register circuit set RG104b by inputting command data C8b3, and can execute the Q reset operation with respect to the register circuit set RG104b by inputting command data C8b4.

In the example of FIG. 25, the command data C8b1 is input at a timing t7b1, the command set CmdOP0 is input from a timing t7b2 to a timing t7b6, and the command data C8b2 is input at a timing t7b7. As a result, the command set CmdOP0 is stored in the register circuit set RG104b. In the example of FIG. 25, the command data C8b3 is input at a timing t7b8, whereby the read operation (internal operation OP0) starts. In the example of FIG. 25, the command data C8b4 is input at a timing t7b9, whereby the command set CmdOP0 stored in the register circuit set RG104b is erased.

As described above, the operation as illustrated in FIG. 24 and the operation as illustrated in FIG. 25 can be executed independently. Therefore, for example, it is also possible to execute at least one of the operation corresponding to the timing t7b1 to the timing t7b7, the operation corresponding to the timing t7b8, and the operation corresponding to the timing t7b9 in FIG. 25 between the timing t7a7 and the timing t7a8, or between the timing t7a8 and the timing t7a9 in FIG. 24.

The examples illustrated in FIGS. 24 and 25 show examples in which the command set CmdOP0 is input by using the command data C8a1 and C8b1. However, for example, the operations as described with reference to FIGS. 24 and 25 may be executed in the operation mode as described with reference to FIG. 15. Even when the command set CmdOP0 is input by using the data signal input terminal X1 as described with reference to FIG. 19, the operations as illustrated in FIGS. 24 and 25 may be executed.

The examples illustrated in FIGS. 24 and 25 show examples in which when the Q execution operation with respect to the register circuit sets RG104a and RG104b is executed, the command data C8a3 and C8b3 are input. However, for example, the Q execution operation with respect to the register circuit sets RG104a and RG104b may be automatically executed by the operation mode as described with reference to FIG. 15, and the command corresponding to the command data C842 described with reference to FIG. 18.

In this case, for example, the first command set first input during the busy period may be input to the register circuit set RG104a. When the second command set is input before the execution of the first internal operation corresponding to the first command set starts, the second command set may be input to the register circuit set RG104b. The first internal operation corresponding to the first command set may be executed at a timing when the internal operation being executed at the time of inputting the first command set is completed, or at a timing immediately before the internal operation is completed. The second internal operation corresponding to the second command set may be executed at a timing when the first internal operation is completed, or at a timing immediately before the first internal operation is completed. For example, when the third command set is further input after a timing when the first internal operation starts, the third command set may be input to the register circuit set RG104a. The third internal operation corresponding to the third command set may be executed at a timing when the second internal operation is completed, or at a timing immediately before the second internal operation is completed.

Even when the write operation is executed in the semiconductor storage device according to the embodiment, the operation as described with reference to FIGS. 21 and 22 can be executed.

Eighth Embodiment

Figure 26:
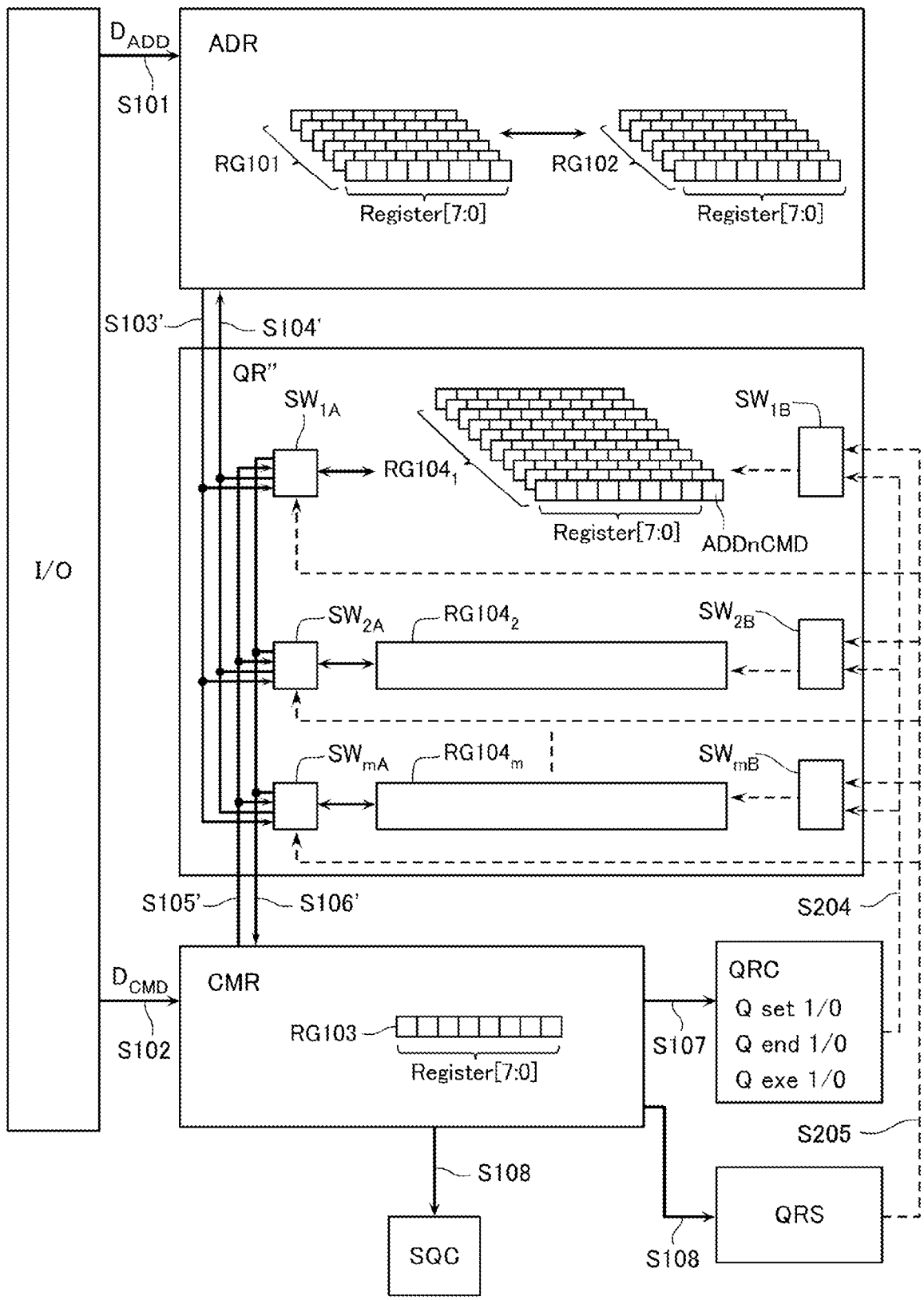
FIG. 26 is a schematic block diagram illustrating a partial configuration of a memory die according to an eighth embodiment.

Next, a semiconductor storage device according to an eighth embodiment will be described with reference to FIG. 26. FIG. 26 is a schematic block diagram illustrating a configuration of the semiconductor storage device according to the embodiment.

The semiconductor storage device according to the eighth embodiment is basically configured in the same manner as that of the semiconductor storage device according to the first embodiment. However, as illustrated in FIG. 26, the semiconductor storage device according to the eighth embodiment includes a queue register QR" instead of the queue register QR with reference to FIG. 7. The semiconductor storage device according to the eighth embodiment includes a queue register selection circuit QRS.

The queue register QR" is connected to the address register ADR via a path S103' and a path S104', connected to the command register CMR via a path S105' and a path S106', thereby bidirectionally performing the input and output of data with respect to the address register ADR and the command register CMR.

The queue register QR" includes m (m is a natural number of 2 or more) pieces of register circuit sets $RG104_1$ to $RG104_m$ instead of one register circuit set RG104 as described with reference to FIG. 7. Each of m pieces of the register circuit sets $RG104_1$ to $RG104_m$ is configured in the same manner as that of the register circuit set RG104 described with reference to FIG. 7.

The queue register QR" includes m pieces of switch circuits $SW_{1A}$ to $SW_{mA}$ provided between the register circuit sets $RG104_1$ to $RG104_m$ and the paths S103', S104', S105', and S106'. The switch circuits $SW_{1A}$ to $SW_{mA}$ may include, for example, configurations corresponding to the switch circuits in the paths S103, S104, S105, and S106 (FIG. 7).

The queue register QR" includes m pieces of switch circuits $SW_{1B}$ to $SW_{mb}$ provided between the register circuit sets $RG104_1$ to $RG104_m$ and a path S204. The switch circuits $SW_{1B}$ to $SW_{mB}$ may include, for example, configurations corresponding to the switch circuits in the paths S201, S202, and S203 described with reference to FIG. 7.

The queue register selection circuit QRS is connected to m pieces of the switch circuits $SW_{1B}$ to $SW_{mb}$ via a path S205. The path S205 may include, for example, m pieces of wiring. The queue register selection circuit QRS may include, for example, an MOS transistor connected to these m pieces of wiring.

Figure 27:
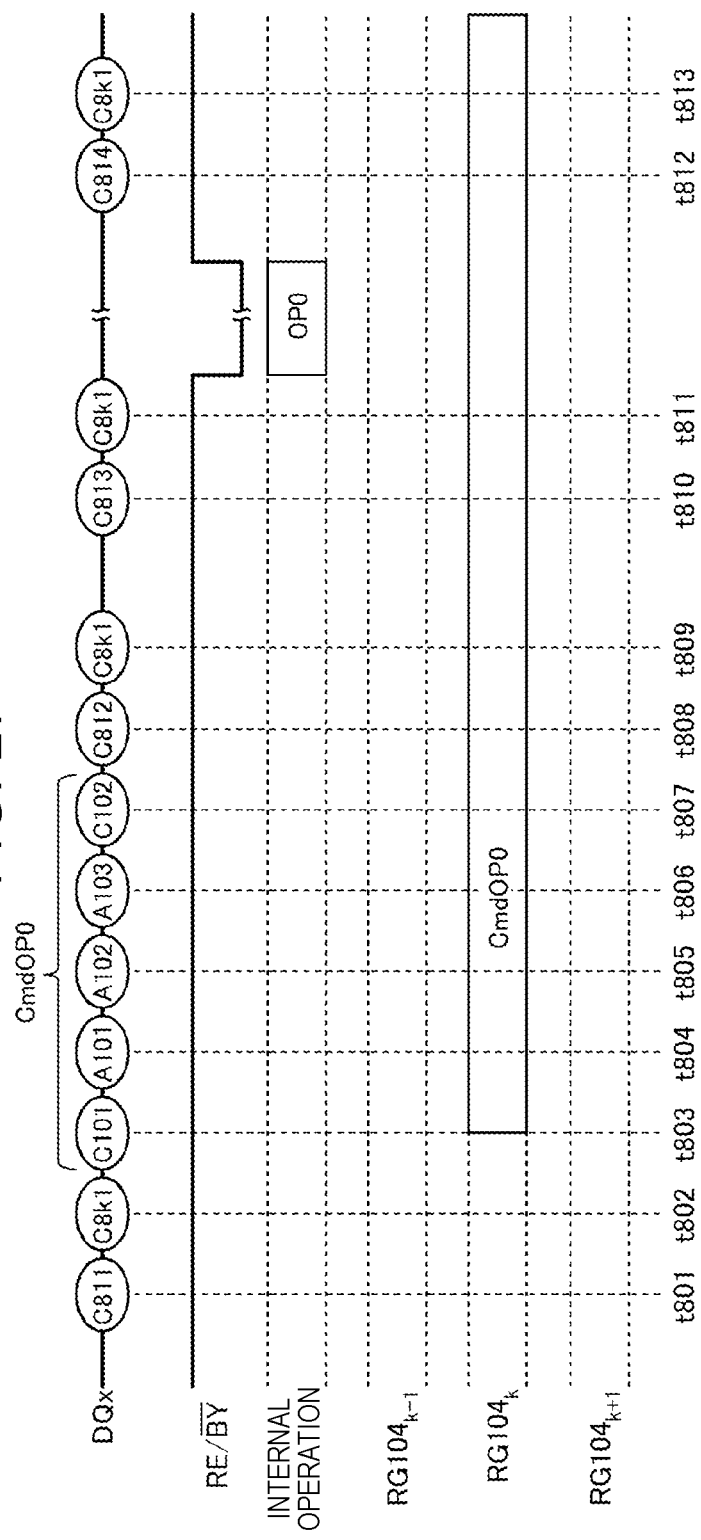
FIG. 27 is a timing chart illustrating an operation of the memory die according to the eighth embodiment.

FIG. 27 is a timing chart illustrating an operation of the semiconductor storage device according to the embodiment.

The semiconductor storage device according to the eighth embodiment basically operates in the same manner as that of the semiconductor storage device according to the first embodiment. However, the semiconductor storage device according to the eighth embodiment can independently execute the Q set operation, the Q end operation, the Q execution operation, and the Q reset operation with respect to m pieces of the register circuit sets $RG104_1$ to $RG104_m$.

For example, as illustrated in FIG. 27, the semiconductor storage device according to the eighth embodiment can execute the Q set operation with respect to a k-th register circuit set $RG104_k$ by inputting the command data C811 and command data C8k1 (k is an integer of 1 or more and m or less), can execute the Q end operation with respect to the k-th register circuit set $RG104_k$ by inputting the command data C812 and the command data C8k1, can execute the Q execution operation with respect to the k-th register circuit set $RG104_k$ by inputting the command data C813 and the command data C8k1, and can execute the Q reset operation with respect to the k-th register circuit set $RG104_k$ by inputting the command data C814 and the command data C8k1.

The command data C8k1 is a command for specifying which of m pieces of the register circuit sets $RG104_1$ to $RG104_m$ is to be accessed.

In the example illustrated in FIG. 27, the command data C811 is input at a timing t801, the command data C8k1 is input at a timing t802, the command set CmdOP0 is input from a timing t803 to a timing t807, the command data C812 is input at a timing t808, and the command data C8k1 is input at a timing t809. As a result, the command set CmdOP0 is stored in the register circuit set RG104$_k$. In the example of FIG. 27, the command data C813 is input at a timing t810, and the command data C8k1 is input at a timing t811, whereby the read operation (internal operation OP0) starts. In the example of FIG. 27, the command data C814 is input at a timing t812, and the command data C8k1 is input at a timing t813, whereby the command set CmdOP0 stored in the register circuit set RG104$_k$ is erased.

In the example illustrated in FIG. 27, the command data C8k1 is input even when the Q end operation is executed at the timing t809. However, for example, when the Q end operation is executed, the input of the command data C8k1 may be able to be omitted. In the example illustrated in FIG. 27, the command data C8k1 is input even when the Q reset operation is executed at the timing t813. However, for example, when the Q reset operation is executed, the input of the command data C8k1 may be able to be omitted, and the Q reset operation with respect to all the register circuit sets RG104$_k$ may be executed.

In the semiconductor storage device according to the eighth embodiment, the number of operable register circuit sets RG104 may be specified by setting the operation mode. In this case, for example, all of m pieces of the register circuit sets RG104$_1$ to RG104$_m$ may be operated, only one thereof may be operated, and all thereof may not be operated.

The example illustrated in FIG. 27 shows an example in which the command set CmdOP0 is input by using the command data C811. However, for example, the semiconductor storage device according to the embodiment may be operated in the operation mode as described with reference to FIG. 15. In the semiconductor storage device according to the embodiment, a command set CmdOP0' may be input by using the data signal input terminal X1 as described with reference to FIG. 19.

The example illustrated in FIG. 27 shows an example in which the command data C813 and the command data C8k1 are input when the Q execution operation with respect to the register circuit sets RG104$_1$ to RG104$_m$ is executed. However, for example, the Q execution operation with respect to the register circuit sets RG104$_1$ to RG104$_m$ may be automatically executed by the operation mode as described with reference to FIG. 15, and the command corresponding to the command data C842 described with reference to FIG. 18.

Even when the write operation is executed in the semiconductor storage device according to the embodiment, the operation as described with reference to FIGS. 21 and 22 can be executed.

Other Embodiments

The above-described embodiments are merely examples, and may be changed.

For example, FIGS. 2 and 3 illustrate an example in which a plurality of memory dies MD and the controller die CD are stacked on the mounting substrate MSB, and the pad electrodes P of the mounting substrate MSB, the plurality of memory dies MD, and the controller die CD are connected to each other via the bonding wire B. However, the memory dies MD may be stacked in a predetermined area on the mounting substrate MSB, and the controller die CD may be arranged in another area on the mounting substrate MSB. Instead of stacking all the memory dies MD at one place, the plurality of stacked memory dies MD may be dispersed and stacked at a plurality of places. All the memory dies MD may be provided directly on the mounting substrate MSB. The pad electrodes P of the mounting substrate MSB and the plurality of memory dies MD may be connected to each other by another electrode and wiring instead of the bonding wire B. For example, the pad electrodes P thereof may be connected to each other by an electrode penetrating the substrate of the memory die MD, and a so-called through silicon via (TSV) electrode.

For example, in the above-described example, the memory cell array MCA is configured as a so-called flash memory including the memory transistor including the charge storage film in the gate insulating film. However, the above-described configuration is merely an example, and various configurations may be applied as the memory cell array. For example, the memory cell array may be a phase-change memory which includes a chalcogenide film such as GeSbTe, and in which a crystal state of the chalcogenide film changes according to the write operation. The memory cell array may be a magnetoresistive random access memory (MRAM) which includes a pair of ferromagnetic films arranged opposite to each other and a tunnel insulating film provided between the ferromagnetic films, and in which a magnetization direction of the ferromagnetic film changes according to the write operation. The memory cell array may be a resistive random access memory (ReRAM) which includes a pair of electrodes and a metal oxide provided between the electrodes, and in which the electrodes are electrically connected to each other via a filament such as an oxygen defect according to the write operation. The memory cell array may be a dynamic random access memory (DRAM) which includes a capacitor and a transistor, and which charges and discharges the capacitor during the write operation and the read operation. The memory cell array may have other configurations.

For example, in the above-described example, the number of bits of the register column in the command register CMR, and the number of bits of the register column in the address register are 8 bits, and the number of bits of the plurality of register columns in the queue register QR is 9 bits. That is, the number of bits of the register column in the queue register QR is one bit greater than the number of bits of the register column in the command register CMR and the number of bits of the register column in the address register. However, the number of bits of the register column in the queue register QR may be two bits or more greater than the number of bits of the register column in the command register CMR and the number of bits of the register column in the address register.

For example, in the above-described example, an example in which the input and output of the command set and the user data is executed via the 8-bit data signal input and output terminals DQ0 to DQ7 is described. However, the number of data signal input and output terminals may be appropriately changed.

In the same manner, in the fifth embodiment described with reference to FIGS. 19 and 20, the input and output circuit I/O is provided with the data signal input terminal X1 corresponding to the 1-bit data in addition to the data signal input and output terminals DQ0 to DQ7. The command set is input to the queue register QR via the data signal input terminal X1 corresponding to the 1-bit data. However, for example, the input and output circuit I/O may be provided with a data signal input terminal corresponding to the data of two bits or more in addition to the data signal input and output terminals DQ0 to DQ7. The command set may be input to the queue register QR via the data signal input terminal corresponding to the data of two bits or more.

[Others]

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
a memory cell array including a plurality of memory cells; and
a peripheral circuit that is connected to the memory cell array, and is configured to input and output user data in response to an input of a command set, the command set including command data and address data,
wherein the peripheral circuit includes
a command register including an n-bit first register column capable of storing n (n is a natural number) bit data forming the command data,
an address register including an n-bit second register column capable of storing n-bit data forming the address data, and
a queue register including a plurality of third register columns capable of storing at least (n+1) bit data, wherein each of the third register columns is capable of storing either the n-bit data forming the command data or the n-bit data forming the address data.

2. The semiconductor storage device according to claim 1, wherein each of the third register columns includes
a first register circuit connected to the first register column and the second register column, and capable of storing an n-bit data, and
a second register circuit capable of storing at least 1-bit data.

3. The semiconductor storage device according to claim 2, further comprising:
a first switch circuit connected between the first register circuit and the first register column; and
a second switch circuit connected between the first register circuit and the second register column,
wherein, when the data stored in the first register circuit is transferred to the first register column or the second register column,
the first switch circuit goes into an ON state and the second switch circuit goes into an OFF state when first information is stored in the second register circuit, and
the first switch circuit goes into the OFF state and the second switch circuit goes into the ON state when second information is stored in the second register circuit.

4. The semiconductor storage device according to claim 3, further comprising:
a third switch circuit connected between the first register circuit and the first register column; and
a fourth switch circuit connected between the first register circuit and the second register column,
wherein, when the n-bit data is input to the first register circuit,
the first information is input to the second register circuit when the third switch circuit is in the ON state and the fourth switch circuit is in the OFF state, and
the second information is input to the second register circuit when the third switch circuit is in the OFF state and the fourth switch circuit is in the ON state.

5. The semiconductor storage device according to claim 3, wherein, when the n-bit data is input to the first register circuit,
the first information is input to the second register circuit when the first switch circuit is in the ON state and the second switch circuit is in the OFF state, and
the second information is input to the second register circuit when the first switch circuit is in the OFF state and the second switch circuit is in the ON state.

6. The semiconductor storage device according to claim 1, wherein, in response to an input of first command data, an internal operation corresponding to the command set stored in the queue register is executed without erasing the command set stored in the queue register.

7. The semiconductor storage device according to claim 1, wherein the command set input during the execution of a first internal operation is stored in the queue register, and
after the execution of the first internal operation, a second internal operation corresponding to the command set stored in the queue register is automatically executed.

8. A semiconductor storage device, comprising:
a first memory cell array including a plurality of memory cells; and
a peripheral circuit that is connected to the first memory cell array, and is configured to input and output user data in response to an input of a command set including command data and address data,
wherein the peripheral circuit includes an address register, a command register, and a queue register, and when a first command set including first command data and first address data is input to the semiconductor storage device, the queue register stores at least part of the first command data and the first address data, and
wherein the semiconductor storage device is configured to execute an internal operation corresponding to the command data stored in the command register and the address data of a previously-input command set while the at least part of the first command data and the first address data is stored in the queue register and without erasing the at least part of the first command data and the first address data of the first command set stored in the queue register.

9. The semiconductor storage device according to claim 8, wherein the queue register is capable of storing the at least part of the first command data and the first address data when the first command set is input to the semiconductor storage device during a busy period of the semiconductor storage device, during which a first internal operation is executed, and the semiconductor storage device is configured to automatically execute a second internal operation after the execution of the first internal operation based on the at least part of the first command data and the first address data stored in the queue register.

10. The semiconductor storage device according to claim 9, wherein the at least part of the first command data and the first address data is stored in the queue register when the first command set is input to the semiconductor storage device along with a queue start command and a queue end command.

11. The semiconductor storage device according to claim 9,
wherein the at least part of the first command data and the first address data is stored in the queue register when the first command set is input to the semiconductor storage device during the execution of the first internal operation.

12. The semiconductor storage device according to claim 11, further comprising:
n pieces of first data input terminals that can be used to input the command set; and
a second data input terminal that can be used to input the command set,
wherein the at least part of the first command data and the first address data is stored in the queue register after the first command set is input to the semiconductor storage device via the second data input terminal.

13. The semiconductor storage device according to claim 12,
wherein the at least part of the first command data and the first address data stored in the queue register is erased in response to an input of a queue erase command.

14. The semiconductor storage device according to claim 13, further comprising:
a second memory cell array;
a first cache memory connected to the first memory cell array; and
a second cache memory connected to the second memory cell array,
wherein when a second command set including second address data and second user data is input to the semiconductor storage device during the execution of the first internal operation with respect to the first memory cell array, and the second address data corresponds to the second memory cell array,
the second user data included in the second command set is input to the second cache memory.

15. A method of executing an internal operation in a semiconductor storage device having a memory cell array including a plurality of memory cells and a peripheral circuit that is connected to the memory cell array and is configured to input and output user data in response to an input of a command set including command data and address data, said method comprising:
storing the command data of the command set received by the peripheral circuit in a command register including an n-bit first register column (n is a natural number);
storing the address data of the command set received by the peripheral circuit in an address register including an n-bit second register column; and
in response to a first command, storing (n+1) bit data in one of a plurality of third register columns of a queue register, wherein the (n+1) bit data includes either the command data or the address data and 1-bit data indicating whether the corresponding third register column stores the command data or the address data.

16. The method according to claim 15, further comprising:
in response to a second command, executing an internal operation using the command data that is transferred from one of the third register columns of the queue register to the command register.

17. The method according to claim 16, wherein another internal operation is being executed by the semiconductor storage device while the command data is being stored in one of the third register columns of the queue register.

18. The method according to claim 15, wherein
a first internal operation is being executed by the semiconductor storage device while the command data is being stored in one of the third register columns of the queue register, and
a second internal operation corresponding to the command data stored in one of the third register columns of the queue register begins execution automatically after the first internal operation completes.

19. The method according to claim 15, further comprising:
in response to a second command, executing an internal operation using the command data that is transferred from one of the third register columns of the queue register to the command register; and
in response to a third command, erasing the command data and the address data that are stored in the third register columns of the queue register.

20. The method according to claim 15, further comprising:
executing an internal operation using the command data that is transferred from one of the third register columns of the queue register to the command register; and
executing the internal operation one more time using the same command data that is transferred from one of the third register columns of the queue register to the command register.

* * * * *